(12) United States Patent
Sasaki

(10) Patent No.: US 7,131,881 B2
(45) Date of Patent: Nov. 7, 2006

(54) METHOD OF MANUFACTURING ORGANIC EL DEVICE, AND ORGANIC EL DEVICE

(75) Inventor: Nobuo Sasaki, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/734,251

(22) Filed: Dec. 15, 2003

(65) Prior Publication Data

US 2004/0169462 A1    Sep. 2, 2004

Related U.S. Application Data

(63) Continuation of application No. PCT/JP01/07472, filed on Aug. 30, 2001.

(51) Int. Cl.
  *H05B 33/02*    (2006.01)
  *H05B 33/10*    (2006.01)
(52) U.S. Cl. .................. 445/24; 313/498; 313/504; 313/506; 313/509; 427/66
(58) Field of Classification Search ............ 445/24; 313/498, 506, 504, 509; 427/66
See application file for complete search history.

(56) References Cited

U.S. PATENT DOCUMENTS

| | | | |
|---|---|---|---|
| 4,270,823 A | * | 6/1981 | Kuznetzoff ............ 445/24 |
| 5,855,994 A | * | 1/1999 | Biebuyck et al. ......... 428/209 |
| 6,520,819 B1 | * | 2/2003 | Sakaguchi .............. 445/24 |
| 6,863,961 B1 | * | 3/2005 | Miyashita et al. ......... 428/203 |

FOREIGN PATENT DOCUMENTS

| | | |
|---|---|---|
| JP | 60-57370 | 4/1985 |
| JP | 5-114487 | 5/1993 |
| JP | 5-182763 | 7/1993 |
| JP | 10-162956 | 6/1998 |
| JP | 2000-235891 | 8/2000 |
| JP | 2000-323276 | 11/2000 |
| JP | 2001-148291 | 5/2001 |
| WO | WO 9824271 A1 * | 6/1998 |

OTHER PUBLICATIONS

Sasaki et al., "Selective Growth of Polyacetylene Narrow Wires Utilizing Capillary Action of Catalyst Solution in Grooves", Japanese Journal of Applied Physics, vol. 31, pp. L741-L743, 1992.

* cited by examiner

*Primary Examiner*—Joseph Williams
*Assistant Examiner*—Anthony Perry
(74) *Attorney, Agent, or Firm*—Staas & Halsey LLP

(57) ABSTRACT

Grooves (3R, 3G, 3B) corresponding to red, green and blue respectively are formed on a substrate (40), and the edge portion of each groove (3R, 3G, 3B) is formed so as to be farther from a side of substrate (40) in order. The edge portion of each groove (3R, 3G, 3B) is immersed in an organic EL solution (8R, 8G, 8B) of corresponding color, the grooves (3R, 3G, 3B) are severally filled with the organic EL solution (8R, 8G, 8B) of corresponding color using capillary phenomenon, and thus a full-color organic EL display device is manufactured.

21 Claims, 22 Drawing Sheets

METHOD OF MANUFACTURING ORGANIC EL DEVICE, AND ORGANIC EL DEVICE

This is a continuation of PCT/JP01/07472, filed Aug. 30, 2001.

TECHNICAL FIELD

The present invention relates to a method of manufacturing an organic EL device and an organic EL device, more particularly to a method of manufacturing the organic EL device, by which organic EL elements are formed using capillary phenomenon, and an organic EL device.

BACKGROUND ART

An organic EL (Electroluminescence) display device has advantages that it is easily manufactured in a thin plate state, has quick response time, and consumes less electricity due to no need of back light, which is prospective as a display device that replaces a liquid crystal display device and a CRT (Cathode Ray Tube).

Although one piece of film is able to constitute an organic EL layer (emitting layer) in a monochrome organic EL display device, it is necessary to form organic EL layers corresponding to the three primary colors of red (R), green (G) and blue (G) in each pixel in the case of a full-color organic EL display device. In the organic EL display device of 170 ppi (pixel per inch), for example, the size of one pixel is 150 (m(150 (m and one pixel is constituted by three sub-pixels of which each size is 50 (m(150 (m. The three sub-pixels are a red sub-pixel, a green sub-pixel and a blue sub-pixel. Therefore, it is necessary to form each of a red-emitting organic EL layer, a green-emitting organic EL layer, and a blue-emitting organic EL layer with the width of 50 (m.

In recent years, a high resolution display device having 200 ppi (pixel size: 127 (m, sub-pixel width: 42.3 (m) to 500 ppi (pixel size: 50.8 (m, sub-pixel width: 17 (m) has been required. Further, various kinds of screen size from as small as approximately 2 inches to as large as approximately 30 inches have been required.

The organic EL display device is manufactured by forming TFTs (thin film transistor), insulating films, electrodes, and organic EL layers on a substrate called a mother glass. Even in the case of the organic EL display device having a small screen size, a large substrate with the size of approximately 400 m(500 mm to 730 mm(920 mm is used and a plurality of organic EL display devices are simultaneously manufactured on one substrate in order to reduce manufacturing cost. In future, it is expected that a larger substrate than up to now will be used due to the demand of further reduction of the manufacturing cost and a larger screen size.

In the case of low molecular organic EL material, the organic EL layers of three colors are formed in each pixel region by depositing the organic EL material of red emission, green emission and blue emission on the substrate using a shadow mask. However, in polymeric organic EL material, heat decomposes polymer and thus it is impossible to form the organic EL film by a deposition method. For this reason, in general, a coater capable of performing an inkjet method is generally used, and ink which is made of the organic EL material is sprayed in a dotted state onto the substrate by each sub-pixel to form the organic EL layer.

In the coater for the inkjet method, it is necessary to spray a plurality of ink dots in one sub-pixel region. At this point, it is difficult to form the organic EL layer uniformly in the entire sub-pixel region because of overlapping of dots or the occurrence of gap between dots. Consequently, although the coater for the inkjet method can be applied for a display device having the sub-pixel size of approximately 50 (m(150 (m, it may not be applicable for manufacturing a display device of higher resolution.

Further, as the substrate size increases, it is expected that the position of dots shift from a predetermined position due to the affect of thermal expansion of substrate.

Moreover, since the coater for the inkjet method sprays the organic EL material onto all sub-pixels, it has a drawback that it takes more time in proportion to the number of sub-pixels and thus the manufacturing cost increases.

DISCLOSURE OF THE INVENTION

The object of the present invention is to provide a method of manufacturing an organic EL device and an organic EL device, whose manufacturing is easier and the manufacturing cost is reduced comparing to a conventional method, and which is applicable for a high-resolution display device.

In the present invention, grooves are formed in the insulating film on the substrate and the grooves are filled with a solution in which the organic EL material is dissolved using capillary phenomenon.

For example, in forming the organic EL layer, the solution in which the organic EL material is dissolved is prepared. Then, after the grooves are filled with the solution using capillary phenomenon, the solution is dried to form the organic EL layer in the grooves. Thus, the organic EL layer having a uniform thickness is easily formed. To increase luminous efficiency of organic EL element, there are cases where a buffer layer (such as a hole transport layer and an electron transport layer) is formed between the electrode and the organic EL layer. By selecting a solution in which the material of the buffer layers are dissolved, the buffer layers can be formed using capillary phenomenon as well similar to the organic EL layer.

Further, in the case of using organic electrodes, electrode layers can be formed using capillary phenomenon similar to the organic EL layer by selecting a solution in which the electrode material is dissolved.

When forming a full-color organic EL display device, it is required to individually form the red-emitting organic EL layer, the green-emitting organic EL layer, and the blue-emitting organic EL layer. In the present invention, three sets of grooves are formed per one pixel and any one of the red-emitting organic EL layer, the green-emitting organic EL layer, and the blue-emitting organic EL layer is formed in each set of grooves by using capillary phenomenon. This makes it possible to easily form the organic EL layer having each luminescence color in a uniform thickness, and thus to manufacture the full-color organic EL display device of superior display quality at a low cost.

If the luminous efficiency of the red-emitting organic EL layer, the green-emitting organic EL layer, and the blue-emitting organic EL layer is not the same, adjusting the number or the width of grooves in each set makes apparent luminescence intensity be the same.

Further, individually controlling the luminescence of the organic EL layer of a same set (same luminescence color) in one pixel facilitates gradation display (middle gradation display).

BEST MODE FOR CARRYING OUT THE INVENTION

The embodiments of the present invention will be described based on the drawings as follows.

Figure 1:
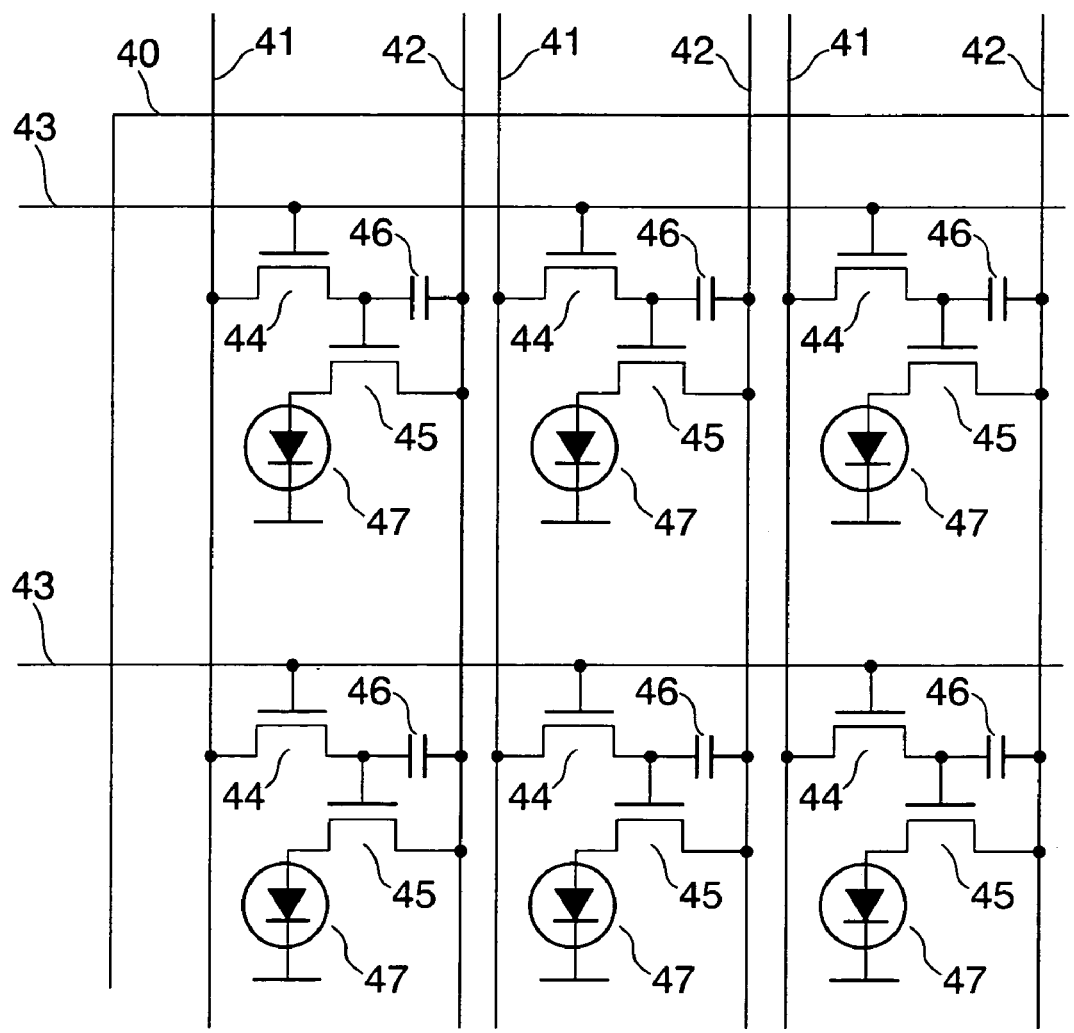
FIG. 1 is a circuit diagram showing an example of the organic EL device of the present invention.

FIG. 1 is the circuit diagram showing an example of the organic EL display device of active matrix type.

A plurality of data lines 41 and power supply lines 42, which extend in vertical directions, and a plurality of scanning lines 43 extending in horizontal directions are formed on a glass substrate 40. Regions surrounded by the data lines 41, the power supply lines 42 and the scanning lines 43 are sub-pixel regions. In this embodiment, the sub-pixels of red emission, green emission and blue emission are arranged in due order in the horizontal directions, and the sub-pixels of a same color are arranged in the vertical directions.

A TFT for switching 44, a TFT for driving 45, a capacitor 46 and an organic EL element (light-emitting element) 47 are provided for each sub-pixel region.

The gate, the source and the drain of the TFT for switching 44 are respectively connected to the scanning line 43, the gate of the TFT for driving 45, and the data line 41. Further, the TFT for driving 45 is connected between the power supply line 42 and the anode of the organic EL element 47.

Furthermore, the capacitor 46 is connected between the gate of the TFT for driving 45 and the power supply line 42.

In the organic EL display device of this configuration, when a predetermined voltage is supplied to each data line 41 and a scanning signal is supplied only to the scanning line 43 of the first row, the TFTs for switching 44 connected to the scanning line 43 on the first row are turned on to accumulate the voltage of data line 41 in the capacitor 46.

A current corresponding to the voltage flows from the power supply line 42 to the organic EL element 47 via the TFT for driving 45, and each organic EL element 47 on the first row emits light. Subsequently, when the predetermine voltage is supplied to each data line 41 and the scanning signal is supplied only to the scanning line 43 on the second row, each organic EL element 47 on the second row emits light.

As described, by sequentially driving the organic EL elements on each row, a desired character or image can be displayed.

Figure 2:
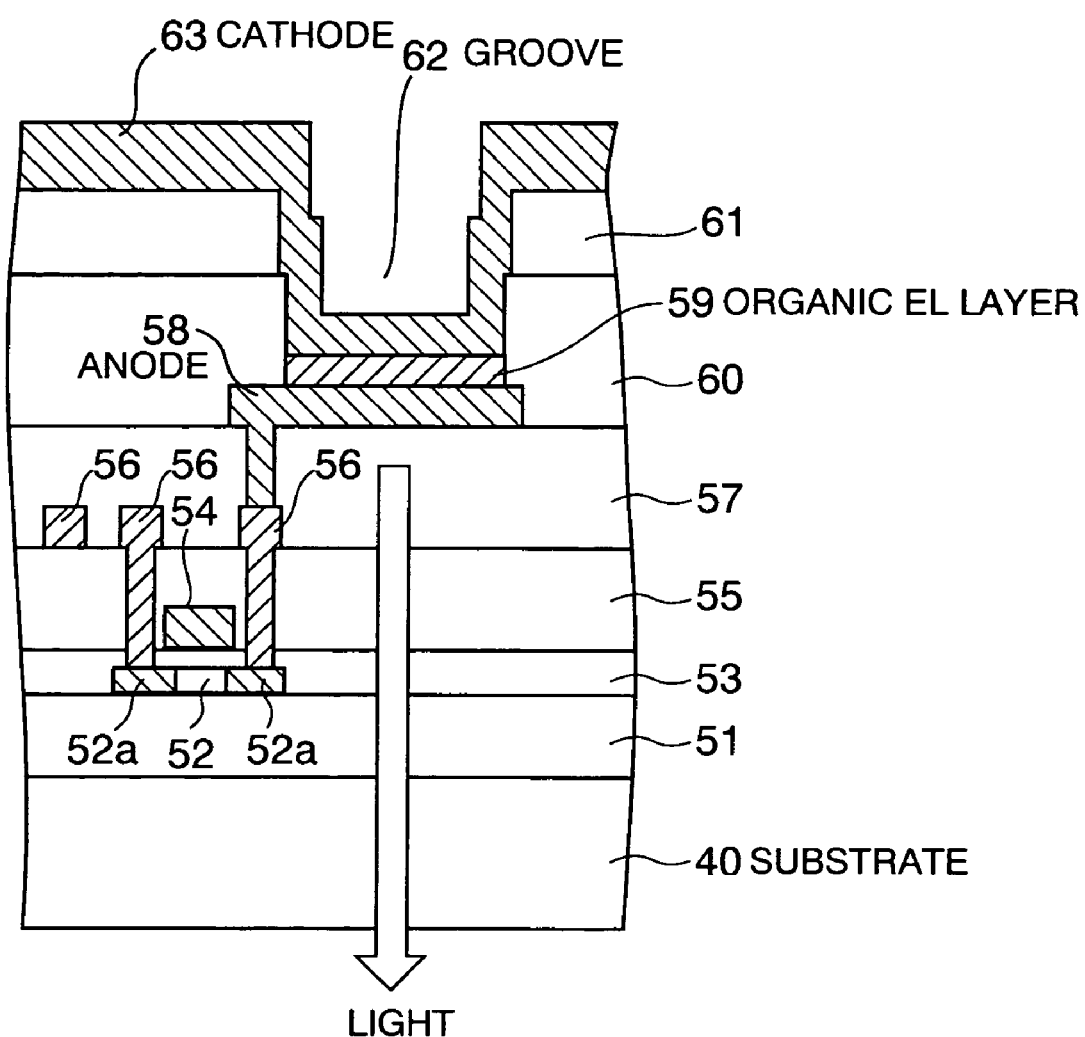
FIG. 2 is a schematic cross-sectional view showing a structure example of the organic EL device of the present invention.

FIG. 2 is the schematic cross-sectional view showing the structure of the above-described organic EL display device of active matrix type. Note that the TFT for switching shown in FIG. 1 is not shown in FIG. 2.

An underlying insulating film 51 made of $SiO_2$ or another insulating material is formed on the glass substrate 40, and a polysilicon film 52 that is an operating layer of TFT is selectively formed on the underlying insulating film 51. A pair of highly concentrated impurity regions 52a, which are the source/drain of TFT, are formed in the polysilicon film 52, sandwiching a channel region.

A gate insulating film 53 made of $SiO_2$ or another insulating material is formed on the polysilicon film 52 and underlying insulating film 51. Further, the gate electrode 54 of TFT is formed on the gate insulating film 53 in the area above the channel region of the polysilicon film 52. Then, an interlayer insulating film 55 made of $SiO_2$ or another insulating material is formed on the gate electrode 54 and gate insulating film 53.

Wiring 56 is formed on the interlayer insulating film 55 in a predetermined pattern. The predetermined wiring of the wiring 56 is electrically connected to the highly concentrated impurity regions 52a of TFT for driving via contact holes.

The wiring 56 is covered with an interlayer insulating film 57 made of $SiO_2$ or another insulating material. An anode 58 made of ITO (Indium-Tin Oxide) is formed on the interlayer insulating film 57 in a predetermined pattern. The anode 58 is electrically connected to one of the highly concentrated impurity regions 52a (source) of TFT for driving via the contact hole and wiring 56.

An insulating film 60 made of $SiO_2$ or another insulating material and an insulating film 61 made of polyimide are laminated on the anode 58 and interlayer insulating film 57. A groove 62 extending in the vertical directions of the document of FIG. 2 is formed in the insulating films (60, 61).

An organic EL layer (emitting layer) 59 is formed on the anode 58 at the bottom of the groove 62. Although the anode 58 is individually formed by each sub-pixel region, the organic EL layer 59 is formed across a plurality of sub-pixels arranged in the longitudinal direction of the groove 62.

A cathode 63 made of an Al/Li (aluminum/lithium) alloy, for example, is formed on the insulating film 61 and the organic EL layer 59 inside the groove 62. The anode 58, the organic EL layer 59 and the cathode 63 constitute the organic EL element 47 shown in FIG. 1.

Note that one or more of the electron transport layer, the hole transport layer and a contact layer (layer for improving the contact property) may be arranged between the anode 58 and cathode 63 in order to improve a luminous efficiency of the organic EL layer 59. Hereinafter, the electron transport layer, hole transport layer and contact layer are referred to as a buffer layer.

In the organic EL display device of this configuration, when a voltage is supplied between the anode 58 and cathode 63, the organic EL layer 59 emits light in a color (red, green or blue) corresponding to its material, and the light emits toward the substrate 40.

In the following, the principle of the method of manufacturing the organic EL device in the present invention will be described. In the present invention, the edge of the groove formed on the substrate is immersed in the solution in which the organic EL material is dissolved, and the groove is filled with the solution by capillary phenomenon to form the organic EL layer.

When the substrate, on which the grooves are formed, is made to stand while its edge is immersed in liquid having property to wet the substrate material, capillary phenomenon allows the liquid to go up in the grooves. The inventors of this application has once conducted research on manufacturing polyacetylene narrow wire by using an $SiO_2$ substrate on which grooves were formed and Ziegler-Natta catalyst. At that time, the inventors confirmed that a toluene solution went up the grooves by way of experiment, and presented the result in the following thesis.

Nobuo Sasaki, Yoshihiro Takao, and Nagisa Ohsako, 'Selective Growth of Polyacetylene Narrow Wires Utilizing Capillary phenomenon of Catalyst Solution in Grooves', Japanese Journal of Applied Physics, Vol.31, pp.L741–L743 (1992).

Figure 3:
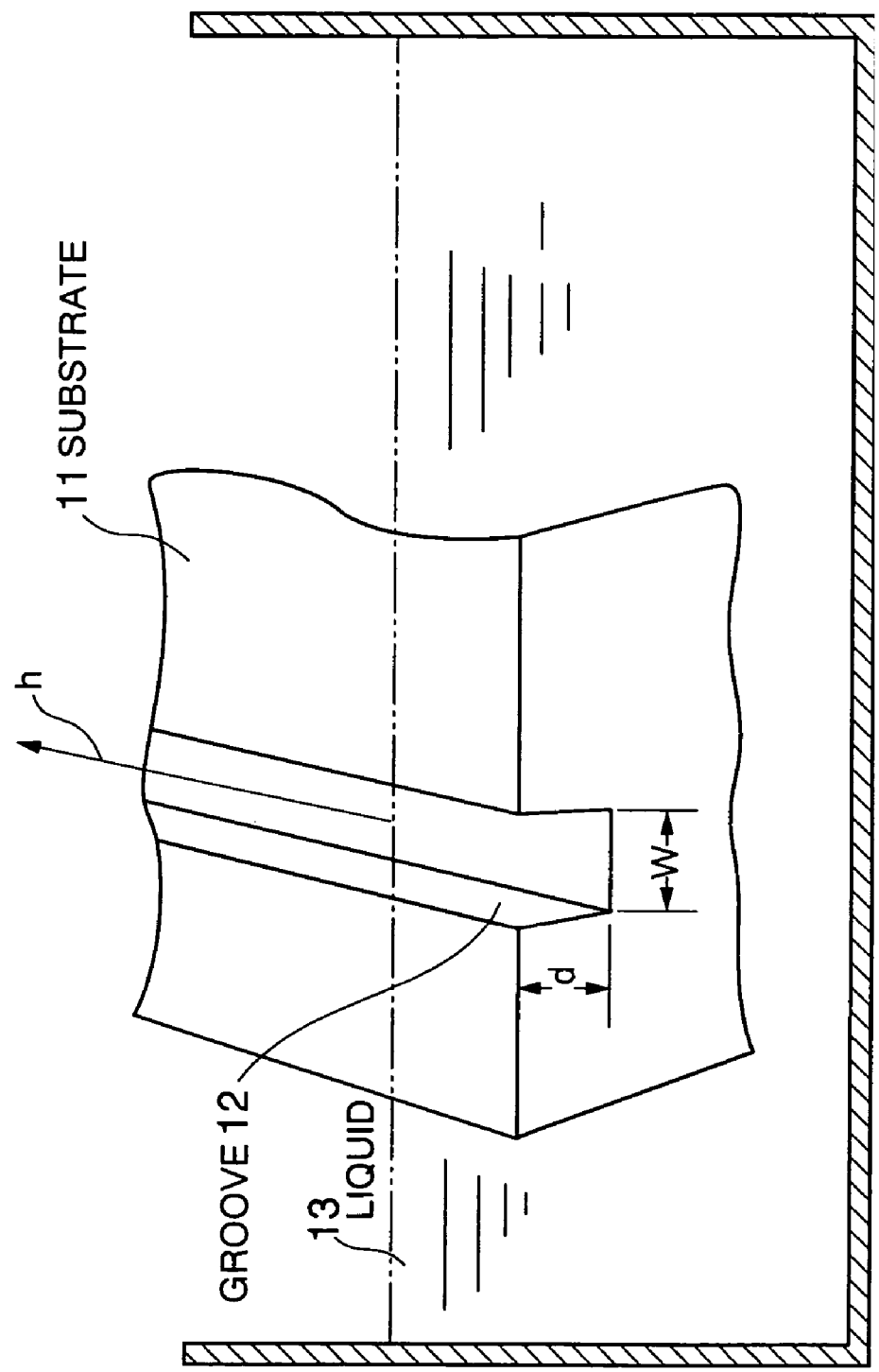
FIG. 3 is a schematic view showing the principle of the present invention.

As shown in FIG. 3, when a groove 12 is formed on a substrate 11 and the edge of groove 12 is immersed in liquid 13 having property to wet the substrate 11, capillary phenomenon allows the liquid 13 to go up in the groove 12. When, in FIG. 3, the substrate 11 is allowed to stand upright to a liquid surface, the relationship shown in the following equation (1) holds supposing that the ingression distance (height of liquid going up) of liquid 13 into the groove 12 is h, the density of liquid 13 is (, the surface tension of liquid 13 is (, gravitational acceleration is g, the width of groove 12 is w, the depth of groove 12 is d, and contact angle of liquid 13 to the substrate 11 is (.

$$h(gw=((2d+w)\cos( \qquad (1)$$

For example, when the width w and the depth d of groove 12 are 0.5(m and 0.5(m, respectively, the ingression distance (height) h of liquid 13 is 17 m. Further, when the width w and the depth d of groove 12 are 3 (m and 1 (m, respectively, the ingression distance (height) h of liquid 13 is 4.8 m.

Note that these are calculated values when the substrate 11 is $SiO_2$, the liquid 13 is toluene, the density ( of liquid 13 is 0.8669 g/cm³, the surface tension ( of liquid 13 is 28.52 dyn/cm and the contact angle ( of liquid 13 to the substrate 11 is 30 degrees.

It is to be noted that the following equation (2) holds when the substrate 11 is immersed in the liquid 13 tilting by angle (from an upright state.

$$h(gw \cos(=((2d+w)\cos( \qquad (2)$$

As it is clear from equation (2), the ingression distance h of liquid 13 can be larger by tilting the substrate 11.

Next, the specific embodiments of the method of manufacturing the organic EL device and the organic EL device in the present invention will be described.

(First Embodiment)

The full-color organic EL display device uses a red-emitting organic EL material, a green-emitting organic EL material, and a blue-emitting organic EL material. For example, the red-emitting organic EL material is copoly(2, 5-didodecyloxy-1,4-phenylenebutadiynylene)(3-dodecyl oxycarbonylthienylenebutadiynylene). Further, the green-emitting organic EL material is copoly(2,5-dialkoxy-p-phenylenebutadiynylene)(2-alkoxy-m-phenylenebutadiynylene). The blue-emitting organic EL material is copoly ((4,4'-biphenylylenelbutadiynylene)(4-dodecyloxy-m-phenylenebutadiynylene).

The embodiments of the present invention uses solutions where each of these organic EL materials is dissolved in toluene, and a band-shaped organic EL layer is formed using capillary phenomenon. The concentration of the organic EL material in the solution is 2% by weight, for example.

In the following, the method of manufacturing the organic EL device (display device) of the first embodiment will be described with reference to the cross-sectional view shown in FIG. 2 and the schematic drawings shown in FIGS. 4 to 17. It is assumed that the TFTs, wiring 56, interlayer insulating film 55, 57, anode 58 and the like are formed on the substrate 40 by a known deposition method and a known photolithography method (refer to FIG. 2).

Figure 4:
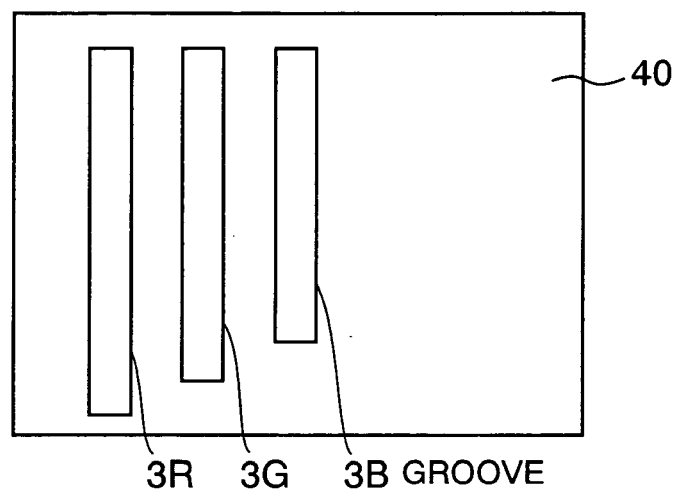
FIG. 4 is a schematic view showing the method of manufacturing the organic EL device of the first embodiment of the present invention (1).

After the anode 58 is formed on the interlayer insulating film 57 by ITO, SiO$_2$ is deposited on the entire upper surface of the substrate 40 to form the insulating film 60, and the insulating film 60 covers the anode 58. Subsequently, a groove for red sub-pixel 3R, a groove for green sub-pixel 3G and a groove for blue sub-pixel 3B are formed on the insulating film 60 as shown in FIG. 4.

Figure 18:
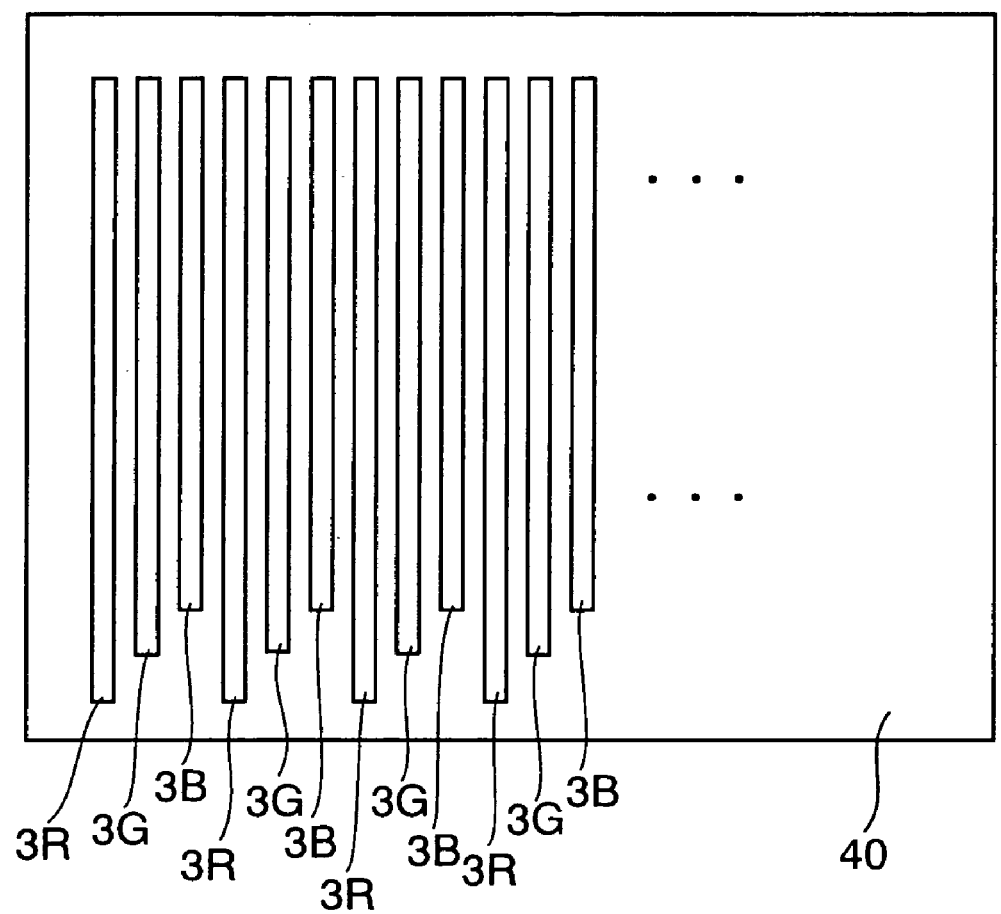
FIG. 18 is a schematic view showing a substrate in which a large number of grooves are formed for each luminescence color.

The three grooves (3R, 3G, 3B) are formed such that the distance of the edge of the groove for blue sub-pixel 3B is farthest from one side of the substrate 40 (the bottom side in FIG. 4), followed by the edge of the groove for green sub-pixel 3G and the edge of the groove for red sub-pixel 3R, which are closer to the side in this order. Although FIG. 4 shows only one each of the grooves (3R, 3G, 3B) for simplifying explanation, a large number of grooves (3R, 3G, 3B) are actually formed on the substrate 40 as shown in FIG. 18.

Figure 5:
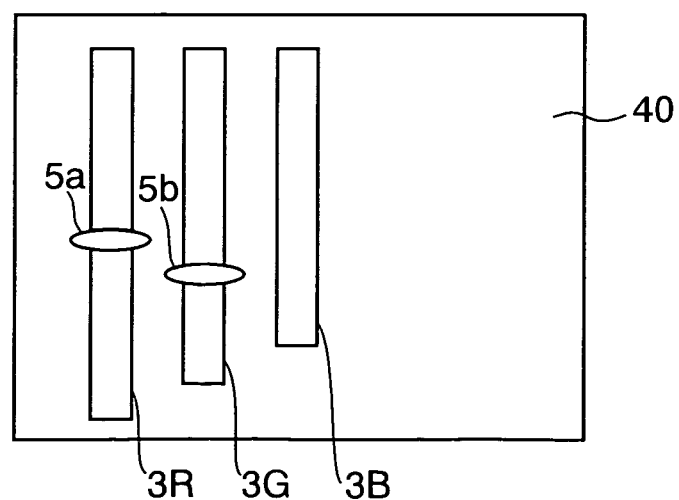
FIG. 5 is a schematic view showing the method of manufacturing the organic EL device of the first embodiment of the present invention (2).

Then, as shown in FIG. 5, stoppers (5a, 5b) are formed in the middle of the groove for red sub-pixel 3R and groove for green sub-pixel 3G to prevent the organic EL material from entering the grooves (3R, 3G). The stopper 5a is arranged at a farther position from one side of the substrate 40 than the stopper 5b. The stoppers (5a, 5b) are made of photoresist and formed via selective exposure and development process. The both stoppers (5a, 5b) are formed on the substrate 40 outside a display region (region where sub-pixels are arranged).

Figure 6:
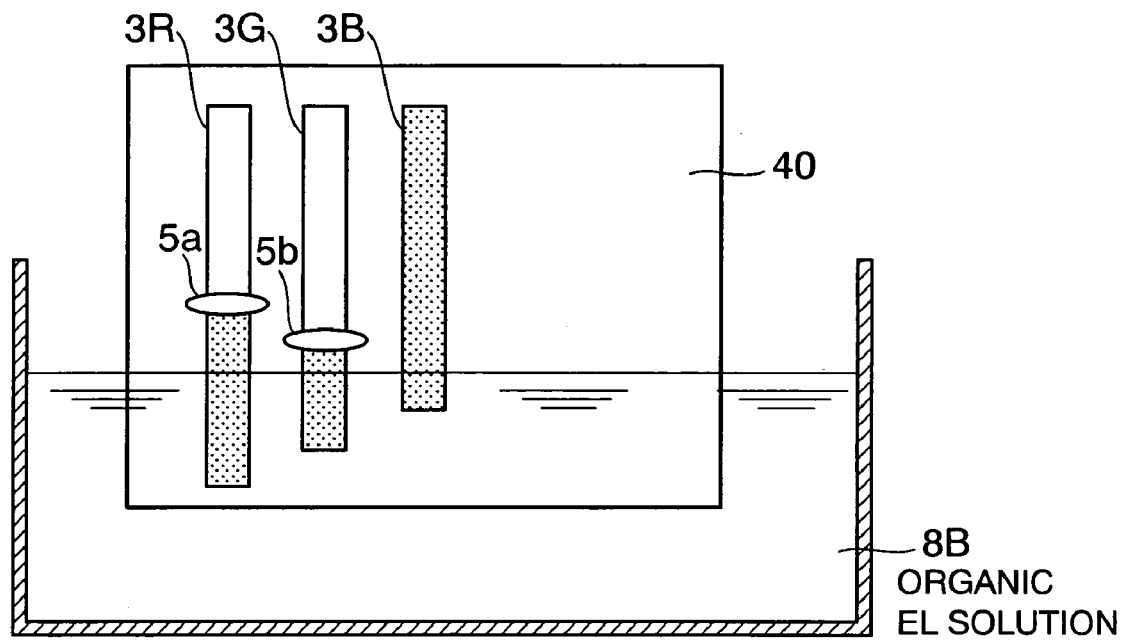
FIG. 6 is a schematic view showing the method of manufacturing the organic EL device of the first embodiment of the present invention (3).

Next, as shown in FIG. 6, there is prepared a container with a polymeric organic EL solution (hereinafter, referred to as a blue solution) 8B that becomes a blue emitting layer. Then, the edge of groove 3B is immersed in the blue solution 8B while standing the substrate 40 upright. Consequently, capillary phenomenon allows the blue solution 8B to enter the groove 3B above the liquid surface and the entire groove 3B is filled with the blue solution 8B.

At this time, the blue solution 8B enters the grooves (3R, 3B) as well, but the stoppers (5a, 5b) block the ingression of blue solution 8B above the stoppers (5a, 5b).

Figure 7:
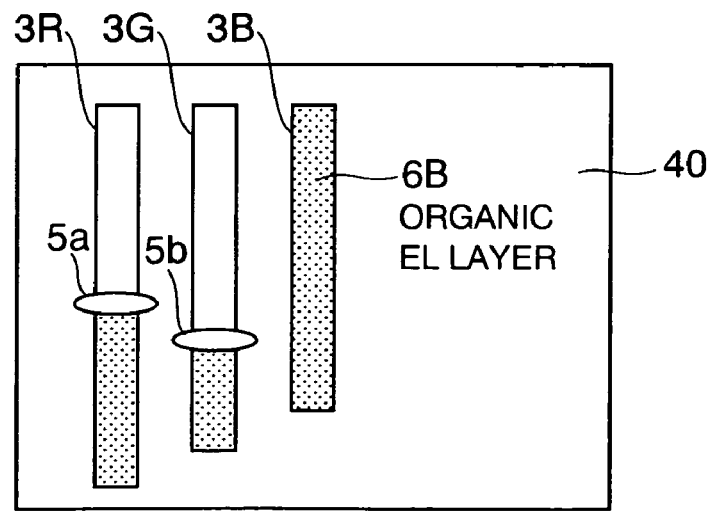
FIG. 7 is a schematic view showing the method of manufacturing the organic EL device of the first embodiment of the present invention (4).

Next, the substrate 40 is pulled out from the blue solution 8B, and dried to let toluene evaporate from the blue solution 8B in the grooves. As a result, a blue-emitting organic EL layer 6B is formed in the groove 3B as shown in FIG. 7.

Figure 8:
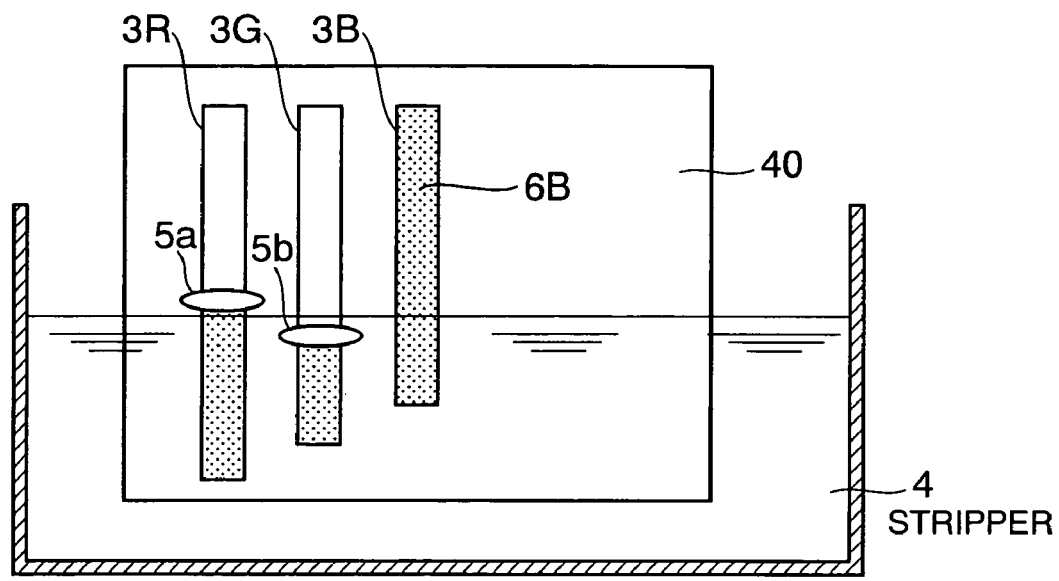
FIG. 8 is a schematic view showing the method of manufacturing the organic EL device of the first embodiment of the present invention (5).
Figure 9:
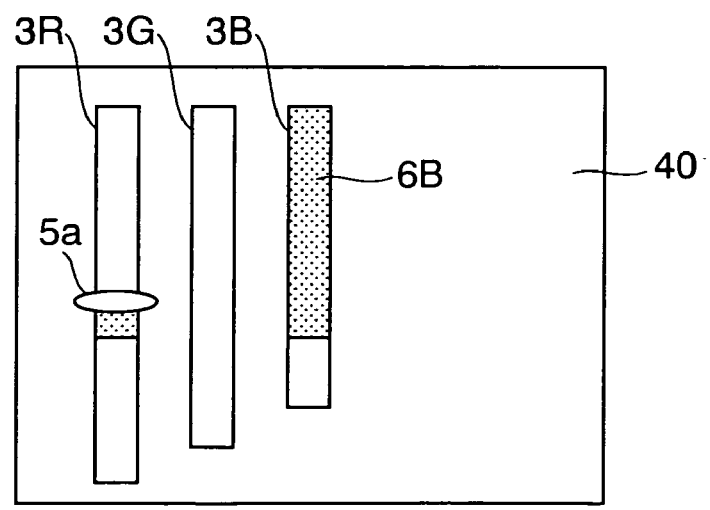
FIG. 9 is a schematic view showing the method of manufacturing the organic EL device of the first embodiment of the present invention (6).

Subsequently, as shown in FIG. 8, a container with resist stripper 4 is prepared, and the substrate 40 is immersed in the resist stripper 4 to a position where the stopper 5b of the groove for green sub-pixel 3G immerses. Then, the substrate 40 is pulled out after the stopper 5b is stripped off. Thus, the organic EL layer 6B under the liquid surface of the stripper 4 is removed as shown in FIG. 9.

Figure 10:
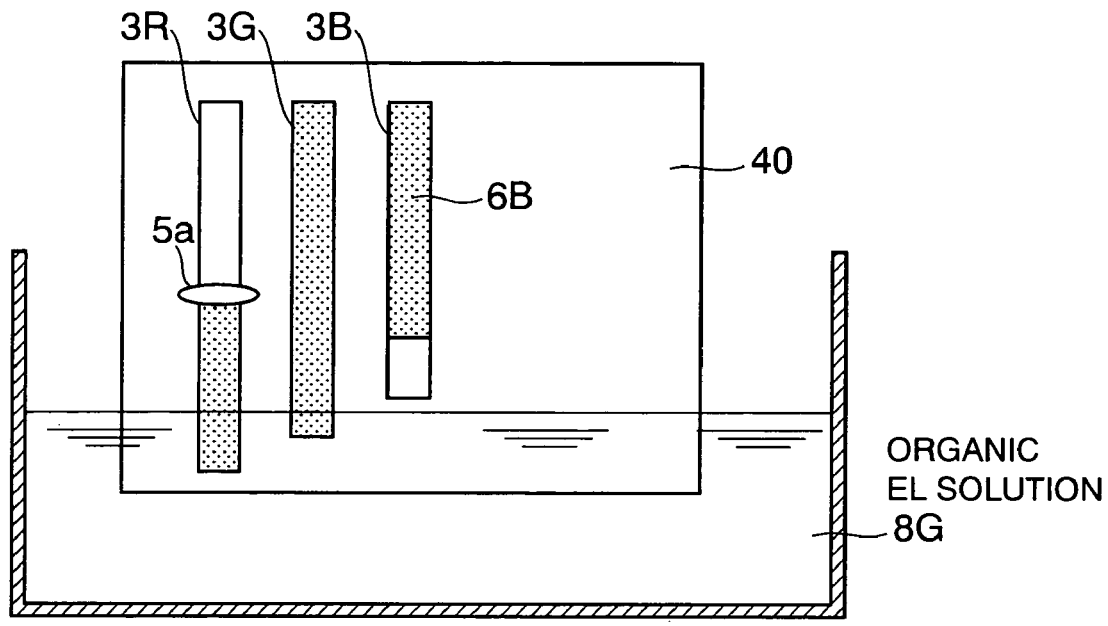
FIG. 10 is a schematic view showing the method of manufacturing the organic EL device of the first embodiment of the present invention (7).

Next, as shown in FIG. 10, there is prepared a container with a polymeric organic EL solution (hereinafter, referred to as a green solution) 8G that becomes a green emitting layer. Then, the edge of groove 3G is immersed in the green solution 8G while standing the substrate 40 upright. Consequently, capillary phenomenon allows the green solution 8G to enter the groove 3G above the liquid surface and the entire groove 3G is filled with the green solution 8G.

At this time, the green solution 8G does not enter the groove 3B since the edge of the groove for blue sub-pixel 3B is apart from the liquid surface of green solution 8G. Further, since the stopper 5a is provided for the groove for red sub-pixel 3R, the green solution 8G enters the groove 3R only to the position of stopper 5a.

Figure 11:
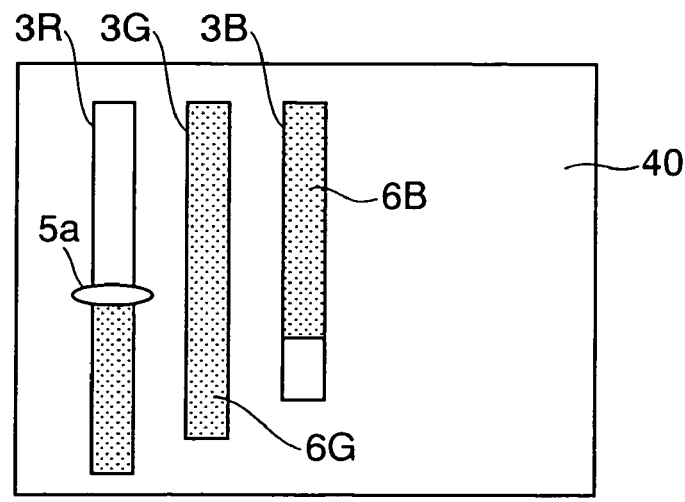
FIG. 11 is a schematic view showing the method of manufacturing the organic EL device of the first embodiment of the present invention (8).

Next, the substrate 40 is pulled out from the green solution 8G, and dried to let toluene evaporate from the green solution 8G in the grooves. As a result, a green-emitting organic EL layer 6G is formed in the groove 3G as shown in FIG. 11.

Figure 12:
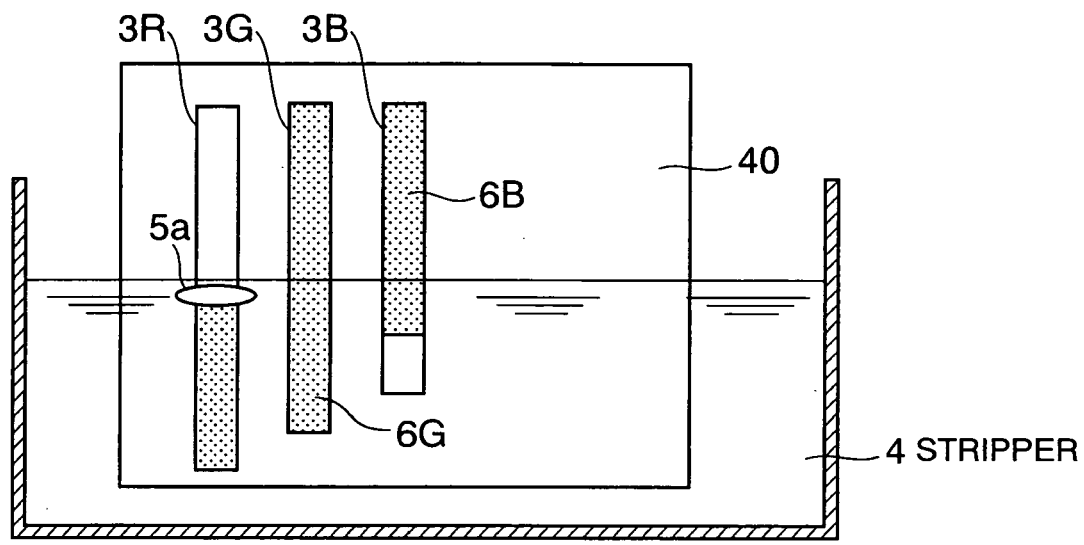
FIG. 12 is a schematic view showing the method of manufacturing the organic EL device of the first embodiment of the present invention (9).
Figure 13:
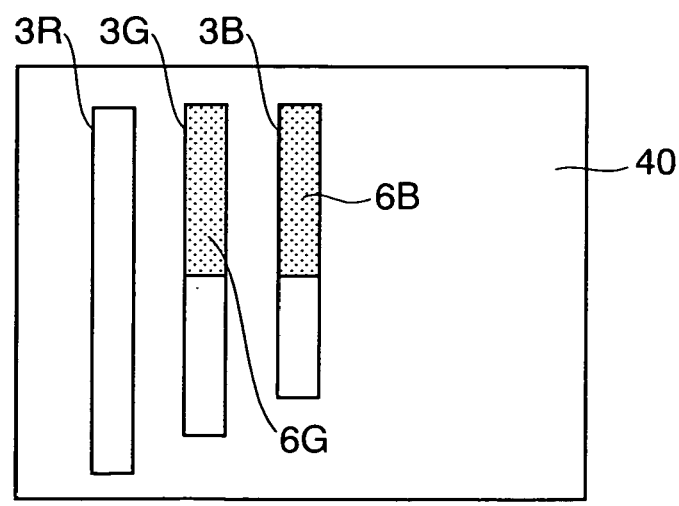
FIG. 13 is a schematic view showing the method of manufacturing the organic EL device of the first embodiment of the present invention (10).

Subsequently, as shown in FIG. 12, the substrate 40 is immersed upright in the resist stripper 4 to the position where the stopper 5a of the groove for red sub-pixel 3R immerses and the stopper 5a is removed. Thus, the green emitting layer 6G under the liquid surface is removed as shown in FIG. 13.

Figure 14:
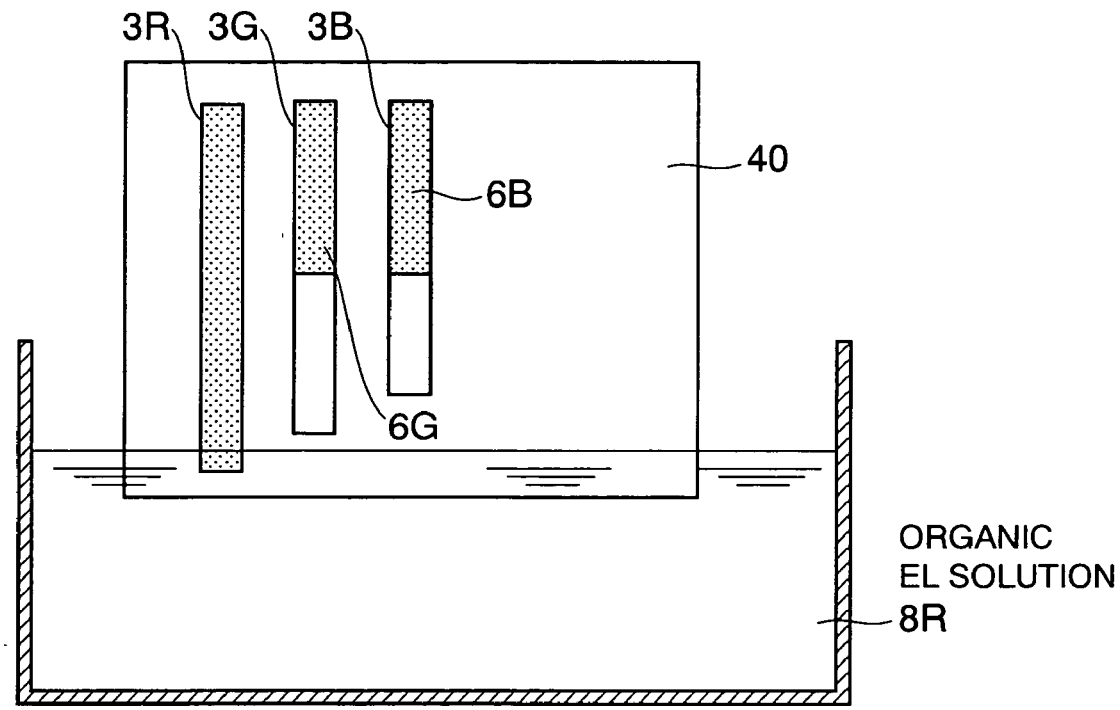
FIG. 14 is a schematic view showing the method of manufacturing the organic EL device of the first embodiment of the present invention (11).

Next, as shown in FIG. 14, there is prepared a container with a polymeric organic EL solution (hereinafter, referred to as a red solution) 8R that becomes a red emitting layer. Then, the edge of groove 3R is immersed in the red solution 8R while standing the substrate 40 upright. Consequently, capillary phenomenon allows the red solution 8R to enter the groove 3R above the liquid surface and the entire groove 3R is filled with the red solution 8R.

At this time, the red solution 8R does not enter the grooves (3B, 3G) since the edge of the groove for blue sub-pixel 3B and groove for green sub-pixel 3G is apart from the liquid surface of red solution 8R.

Figure 15:
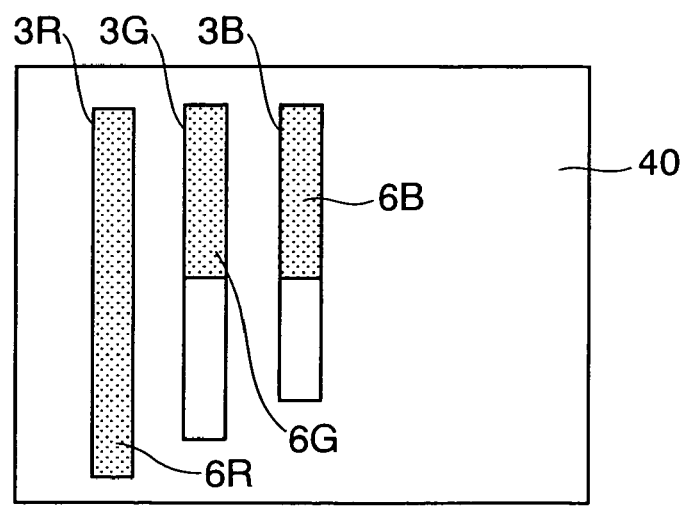
FIG. 15 is a schematic view showing the method of manufacturing the organic EL device of the first embodiment of the present invention (12).

Next, the substrate 40 is pulled out from the red solution 8R in the container, and dried to let toluene evaporate from the red solution 8R in the grooves. As a result, a red emitting layer 6R is formed in the groove 3R as shown in FIG. 15.

Figure 16:
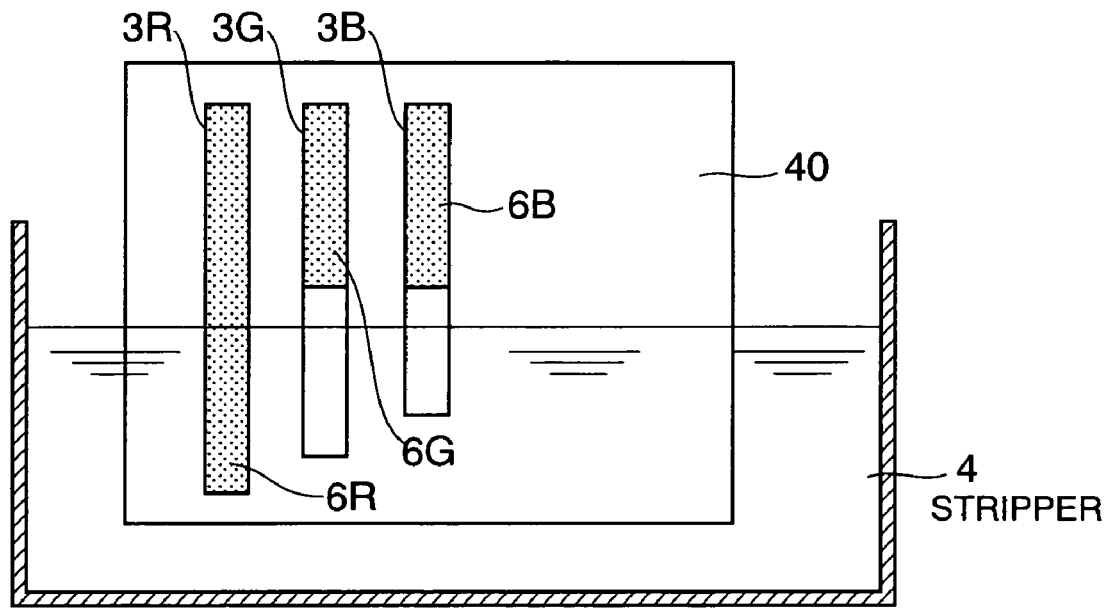
FIG. 16 is a schematic view showing the method of manufacturing the organic EL device of the first embodiment of the present invention (13).

Thus, the edge of groove 3R is immersed in the resist stripper 4 to remove the red emitting layer 6R at the edge portion as shown in FIG. 16.

Figure 17:
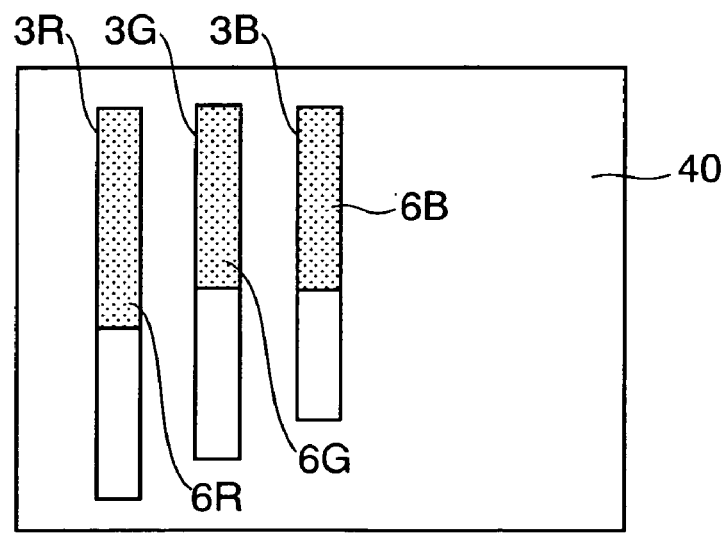
FIG. 17 is a schematic view showing the method of manufacturing the organic EL device of the first embodiment of the present invention (14).

As described above, the red emitting layer 6R, green emitting layer 6G and blue emitting layer 6B are respectively formed in the grooves (3R, 3G, 3B) as shown in FIG. 17.

After that, polyimide is coated on the entire surface to form the insulating film 62, and grooves on which the organic EL layer 59 (6R, 6G, 6B) is exposed are formed in the insulating film 62 (refer to FIG. 2). Then, the Al/Li alloy is deposited on the entire surface by a sputtering method, for example, to form the cathode 63. The organic EL display device is manufactured in this manner.

According to this embodiment, the solution, in which the organic EL material is dissolved, is allowed to enter the grooves using capillary phenomenon to form the organic EL layer, so that the formation of organic EL layer is quite easy and thus the manufacturing cost is reduced, whereas the organic EL layer of a uniform thickness can be formed. Furthermore, it can be applied for the high-resolution organic EL display device by adjusting the width of the grooves (3R, 3G, 3B).

Although description has been made in the above-described embodiment for the example where the polymeric organic EL material was used as the material of organic EL layer, the present invention is not limited to the polymeric organic EL material and it is possible to use the low molecular organic EL material as long as it is soluble in solvent.

Figure 19:
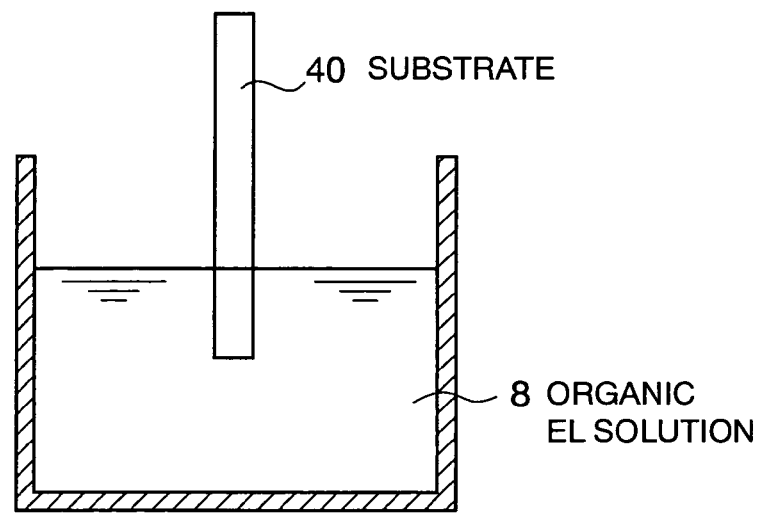
FIG. 19 is a schematic view showing the state where the substrate is made perpendicular and immersed in a solution.
Figure 20:
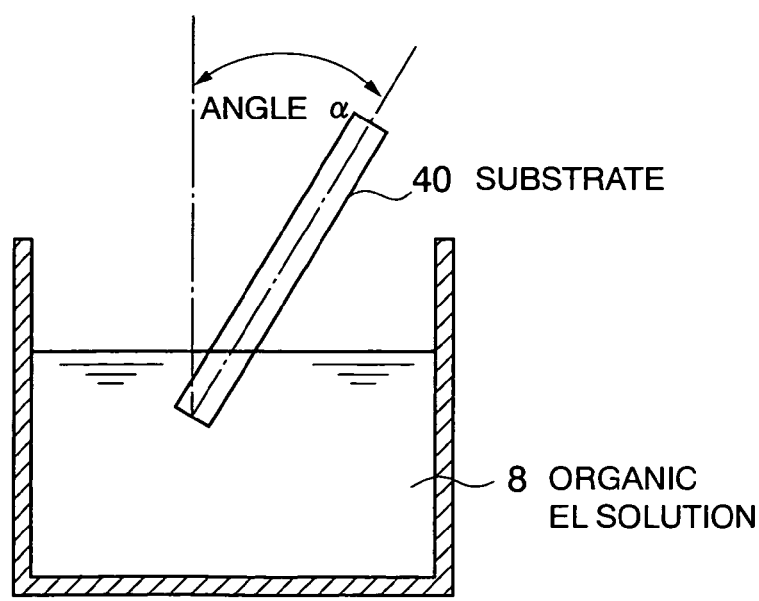
FIG. 20 is a schematic view showing the state where the substrate is tilted and immersed in the solution.

In addition, in the above-described embodiment, the edge portions of grooves (3R, 3G, 3B) were immersed in the solution 8 while standing the substrate 40 upright to the liquid surface of the organic EL solution 8 (8R, 8G, 8B) as shown in FIG. 19. However, the substrate 40 may be immersed in the solution 8 with a slope as shown in FIG. 20. In this case, the distance of the solution 8 going up in the grooves by capillary phenomenon is larger comparing to the case where the substrate 40 is immersed upright in the solution 8.

Moreover, as described above, it is often the case where the buffer layer such as the hole transport layer, electron transport layer and contact layer is arranged.

Figure 21:
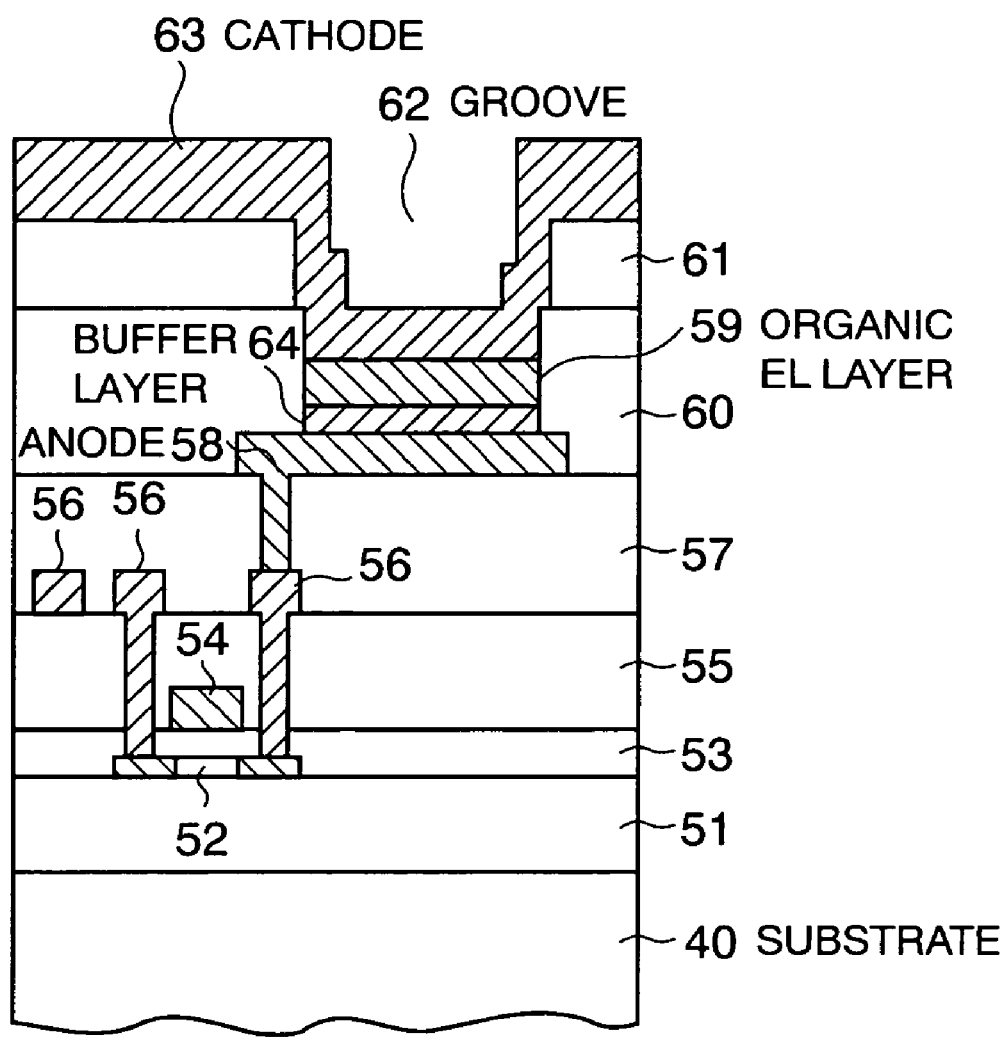
FIG. 21 is a schematic cross-sectional view showing a structure example of the organic EL device where a buffer layer is provided between an electrode and an organic EL layer.

FIG. 21 is the view showing the organic EL display device where a buffer layer (hole transport layer) 64 made up of PEDT/PSS is provided between the anode 58 and organic EL layer 59. This layer is formed by dissolving PEDT/PSS in isopropyl alcohol and filling the grooves with it using capillary phenomenon in the same manner as the above-described forming method of organic EL layer.

Further, since the flow of current between organic EL layers can be disregarded when the buffer layer is in high resistance, the buffer layer is not formed for each organic EL element but may be commonly formed for each organic EL element. In such a case, the anode 58 is formed on the interlayer insulating film 57, the buffer layer 64 and insulating film 60 are further formed on the entire surface of the substrate 40, and then, the grooves are formed in the insulating film 60 to form the organic EL layer using capillary phenomenon as described above.

Although the anode 58 is formed by ITO in the example shown in FIG. 21, it may be formed by conductive polymeric material instead of ITO. In this case, it is also possible to form the layer by filling the grooves with a conductive polymeric material solution using capillary phenomenon similar to the above-described forming method of the organic EL layer. Highly conductive material is required as an electrode material, and the electric conductivity of 30 to 200 S/cm is easily obtained when polyaniline is used for example. An N-methyl 1-2-pyrrolidone solution having 0.5% by weight is used in order to fill the grooves with polyaniline by capillary phenomenon.

Furthermore, although the groove 62 was linearly formed in the above-described first embodiment, the groove 62 may be formed in a bent or curved shape.

Second Embodiment

Figure 22:
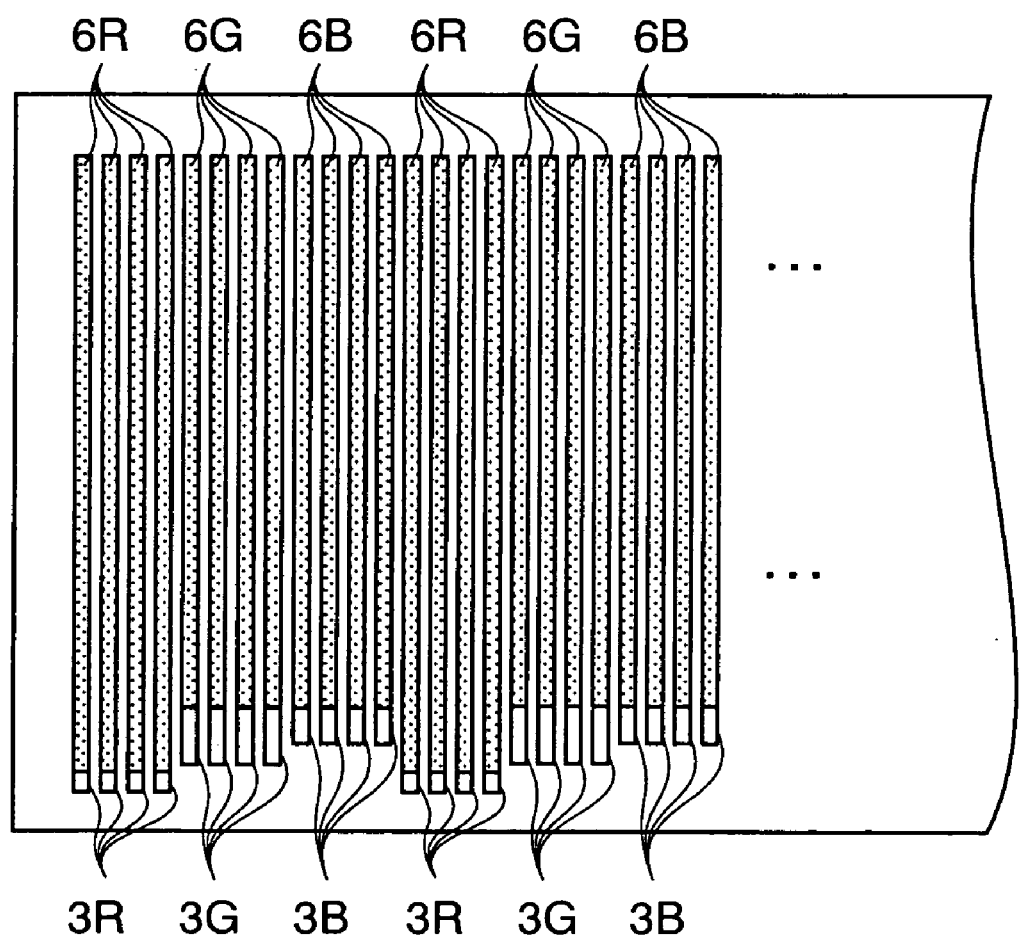
FIG. 22 is a schematic view showing the method of manufacturing the organic EL display device of the second embodiment in the present invention.
Figure 23:
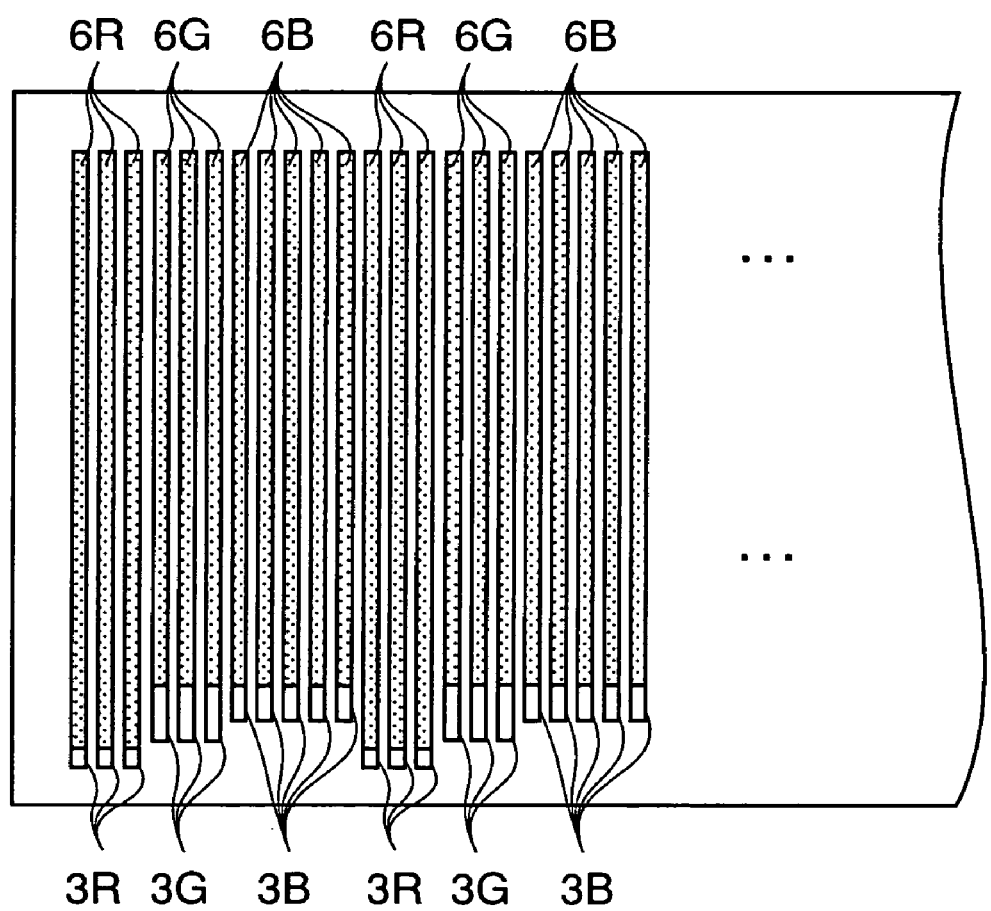
FIG. 23 is a schematic view showing an example where the number of grooves for blue sub-pixel is larger than the number of grooves for red and green sub-pixels.
Figure 24:
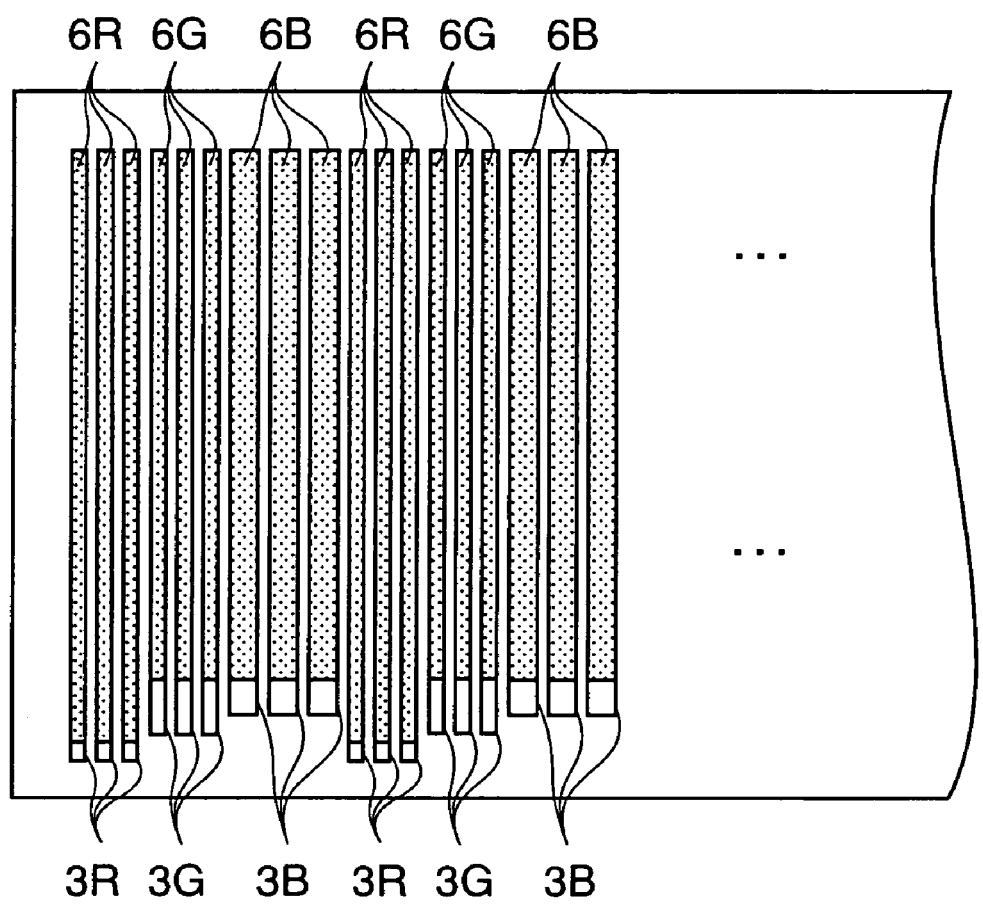
FIG. 24 is a schematic view showing an example where the width of grooves for blue sub-pixel is wider than the width of grooves for red and green sub-pixels.

FIG. 22 is the schematic view showing the method of manufacturing the organic EL display device of the second embodiment in the present invention. Description will be made with reference to the cross-sectional view of FIG. 2 in this embodiment as well.

In this embodiment, after the anode 58 and the interlayer insulating film 60 are formed similar to the first embodiment, a plurality of grooves (4 for each color in FIG. 22) are formed for one anode 58. Note that the three grooves (3R, 3G, 3B) are formed such that the edge of the grooves for red sub-pixel 3R is closest to one side of the substrate 40 (the bottom side in FIG. 22), followed by the grooves for green sub-pixel 3G and the grooves for blue sub-pixel 3B, which become farther from the side of substrate 40 in this order.

Then, the grooves for red sub-pixel 3R is filled with the red solution, the grooves for green sub-pixel 3G is filled with the green solution, the grooves for blue sub-pixel 3B is filled with the blue solution similar to the first embodiment, and thus forming the red-emitting organic EL layer 6R, green-emitting organic EL layer 6G and blue-emitting organic EL layer 6B.

Subsequently, the insulating film 61 is formed, the groove is formed in the insulating film 61 to expose the organic EL layers (6R, 6G, 6B), and then the cathode 63 made up of the Al/Li alloy is formed, similar to the first embodiment.

In addition to the same effects obtained in the first embodiment, this embodiment exerts the effects shown below.

When the luminous efficiency of organic EL layer is different among luminescence colors, the luminescence intensity of the red sub-pixel, green sub-pixel and blue sub-pixel is made to be uniform by adjusting the number of grooves for each color. Generally, the luminous efficiency of the blue organic EL layer is lower than that of the red organic EL layer and green organic EL layer, so that the number of the grooves for red sub-pixel 3R and the grooves for green sub-pixel 3G are set to three each for one sub-pixel, the number of the grooves for blue sub-pixel 3B is set to five for one sub-pixel, and thus the luminescence intensity of each sub-pixel can be uniformized.

Note that the width of the grooves for blue sub-pixel may be thicker than that of the grooves for red sub-pixel 3R and the grooves for green sub-pixel 3G. Accordingly, it is also possible to uniformize the luminescence intensity of each sub-pixel.

(Modified Example)

When a plurality of organic EL layers are formed in one sub-pixel region, as shown in FIG. 22, a plurality of TFTs for driving may be formed for one sub-pixel to allow each organic EL layer to emit light individually. Allowing a plurality of organic EL layers in one sub-pixel to individually emit light facilitates the display of middle gradation.

In other words, the organic EL display device of active matrix type usually displays middle gradation by controlling the electric current flowing in the TFTs for driving. However, in the case of controlling the current flowing in the TFTs for driving to display middle gradation, the variation of TFT characteristics could cause display unevenness. As described above, when a plurality of TFTs for driving are formed per one sub-pixel and gradation is displayed by individually controlling the luminescence of each organic EL layer, the occurrence of display unevenness caused by the variation of TFT characteristics is prevented. Note that a plurality of grooves in one sub-pixel may be formed in different width from each other.

Furthermore, as described above, by forming a plurality of TFTs for driving per one sub-pixel to individually control the luminescence of each organic EL layer, redundancy can be bestowed and the reduction of production yield due to the disconnection of wire or the like can be prevented.

Third Embodiment

FIGS. 25 to 36 are the views showing the method of manufacturing the organic EL display device of the third embodiment in the present invention. Description will be made with reference to the cross-sectional view of FIG. 2 in this embodiment as well.

Figure 25:
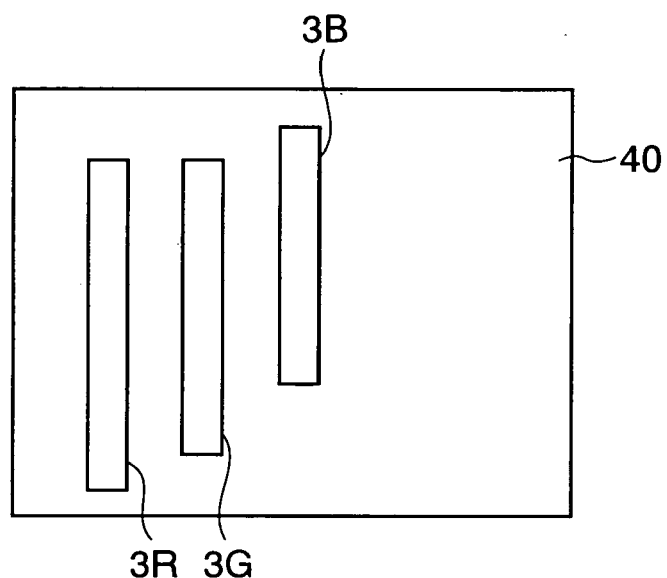
FIG. 25 is a view showing the method of manufacturing the organic EL device of the third embodiment of the present invention (1).

In this embodiment, after the anode 58 and interlayer insulating film 60 are formed on the substrate 40 similar to the first embodiment, the groove for red sub-pixel 3R, groove for green sub-pixel 3G and groove for blue sub-pixel 3B are formed as shown in FIG. 25. Although only one each of the grooves (3R, 3G, 3B) is shown in FIG. 25 to simplify explanation, a large number of the grooves (3R, 3G, 3B) are actually formed on the substrate 40.

At this time, the edge of the three grooves (3R, 3G, 3B) are arranged such that the distance of the edge of the grooves for blue sub-pixel 3B is farthest from one side of the substrate 40 (the bottom side in FIG. 25), followed by the groove for green sub-pixel 3G and the groove for red sub-pixel 3R, which are closer to the side in this order. Additionally, the groove 3B is arranged such that the other end thereof is closer to the other side of the substrate 40 (the top side in FIG. 25) than the other sides of the grooves (3R, 3G).

Figure 26:
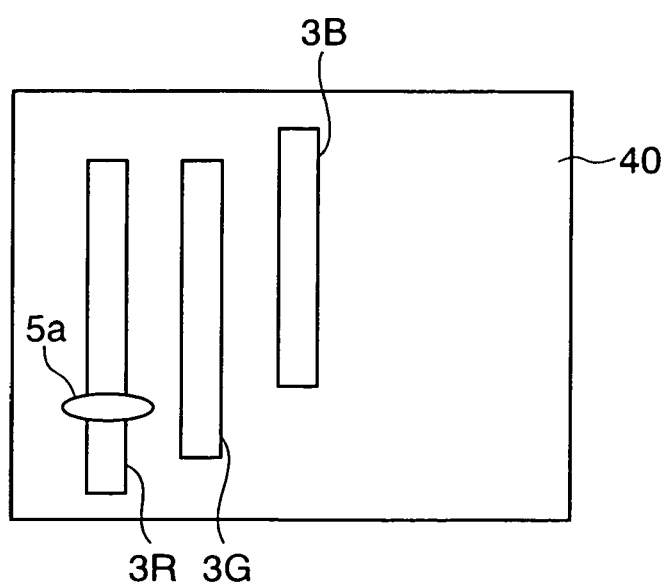
FIG. 26 is a view showing the method of manufacturing the organic EL device of the third embodiment of the present invention (2).

Subsequently, as shown in FIG. 26, the stopper 5a is formed by photoresist to prevent the organic EL solution from entering the groove for red sub-pixel 3R.

Figure 27:
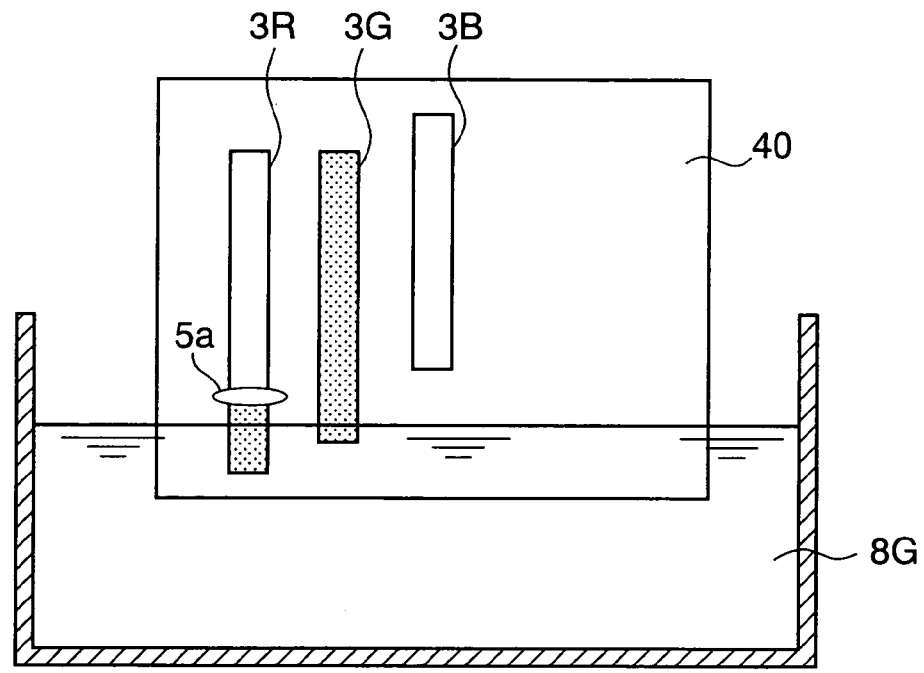
FIG. 27 is a view showing the method of manufacturing the organic EL device of the third embodiment of the present invention (3).

Next, as shown in FIG. 27, there is prepared a container with the polymeric organic EL solution (blue solution) 3G that becomes the green emitting layer. Then, the edge of groove 3G is immersed in the green solution 8G while standing the substrate 40 upright. Consequently, capillary phenomenon allows the green solution 8G to enter the groove 3G above the liquid surface and the entire groove 3G is filled with the green solution 8G.

Figure 28:
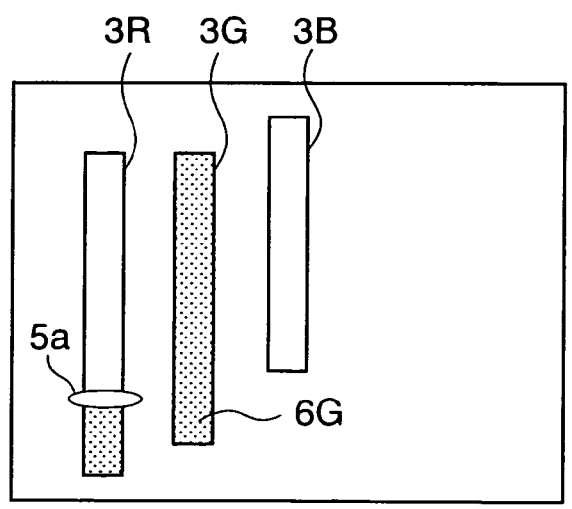
FIG. 28 is a view showing the method of manufacturing the organic EL device of the third embodiment of the present invention (4).

At this time, since the edge of groove 3B is apart from the green solution, the green solution 8G does not enter the groove 3B. Further, the green solution 8G enters the groove 3R to the position of stopper 5a. Next, the substrate 40 is pulled out from the green solution 8G, and dried to let toluene evaporate from the green solution 8G in the grooves. As a result, a green-emitting organic EL layer 6G is formed in the groove 3G as shown in FIG. 28.

Figure 29:
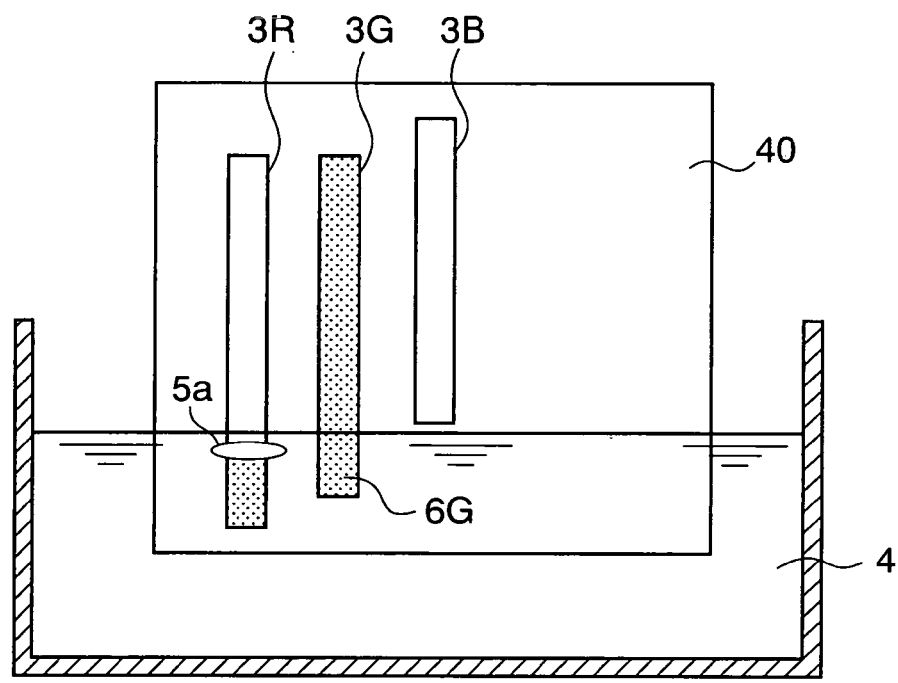
FIG. 29 is a view showing the method of manufacturing the organic EL device of the third embodiment of the present invention (5).
Figure 30:
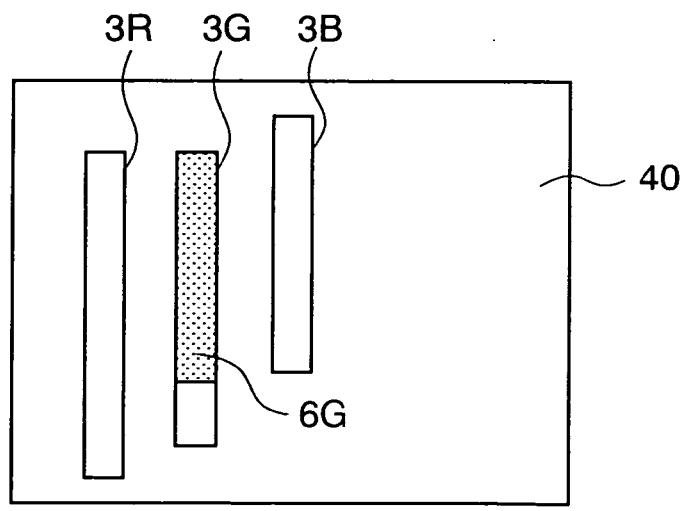
FIG. 30 is a view showing the method of manufacturing the organic EL device of the third embodiment of the present invention (6).

Subsequently, as shown in FIG. 29, a container with the resist stripper 4 is prepared, and the substrate 40 is immersed in the resist stripper 4 to a position where the stopper 5a of the groove for red sub-pixel 3R immerses. Then, the substrate 40 is pulled out after the stopper 5a is stripped off. Thus, the organic EL layer 6G under the liquid surface of the stripper 4 is removed as shown in FIG. 30.

Figure 31:
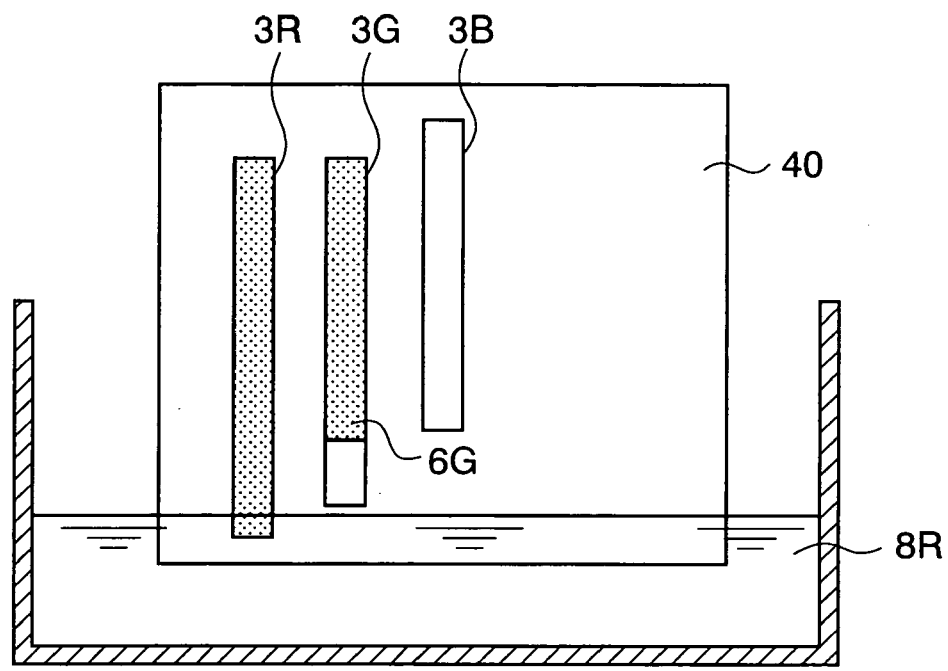
FIG. 31 is a view showing the method of manufacturing the organic EL device of the third embodiment of the present invention (7).

Next, as shown in FIG. 31, a container with the polymeric organic EL solution (red solution) 8R that becomes the red emitting layer is prepared. Then, the edge of groove 3R is immersed in the red solution 8R while standing the substrate 40 upright. Consequently, capillary phenomenon allows the red solution 8R to enter the groove 3R above the liquid surface and the entire groove 3R is filled with the red solution 8R.

At this time, since the edge of the groove for blue sub-pixel 3B and the edge of the groove for green sub-pixel 3G are apart from the red solution 8R, the red solution 8R does not enter the grooves (3B, 3G).

Figure 32:
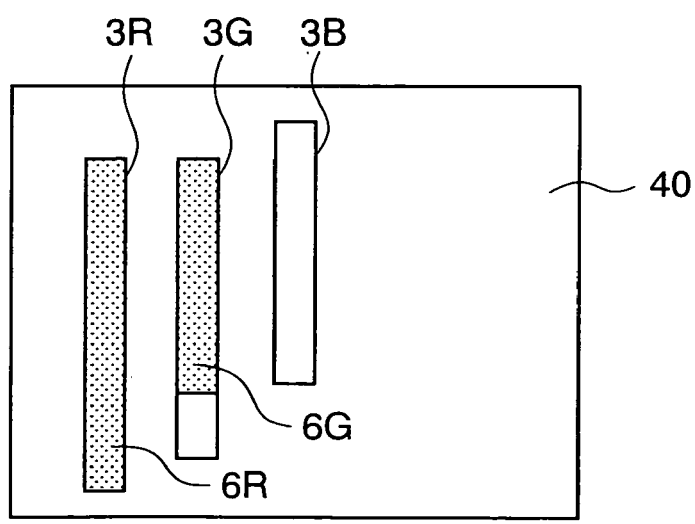
FIG. 32 is a view showing the method of manufacturing the organic EL device of the third embodiment of the present invention (8).

Next, the substrate 40 is pulled out from the container, and dried to let toluene evaporate from the red solution 8R in the groove. As a result, a red-emitting organic EL layer 6R is formed in the groove 3R as shown in FIG. 32.

Figure 33:
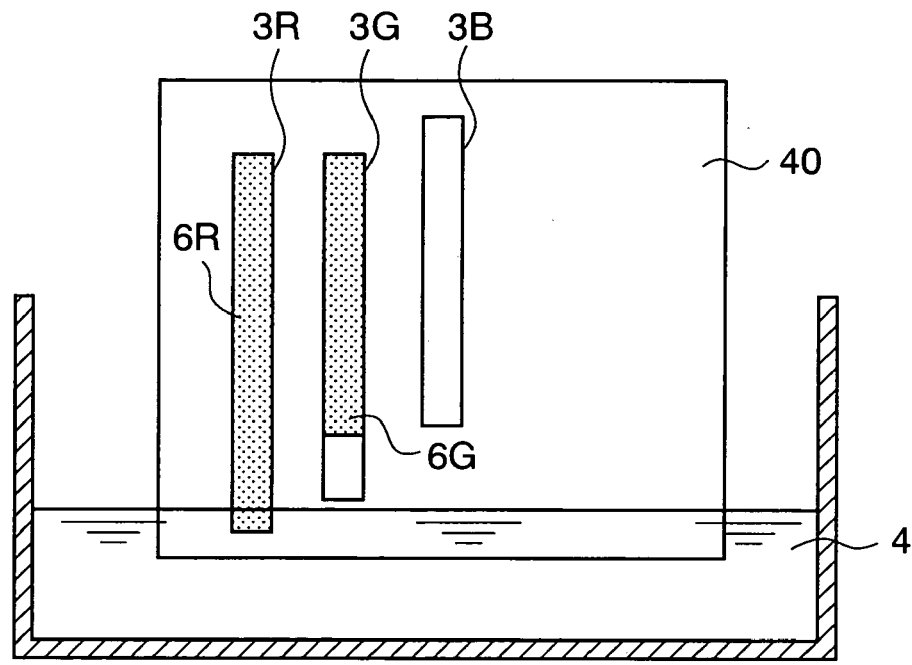
FIG. 33 is a view showing the method of manufacturing the organic EL device of the third embodiment of the present invention (9).
Figure 34:
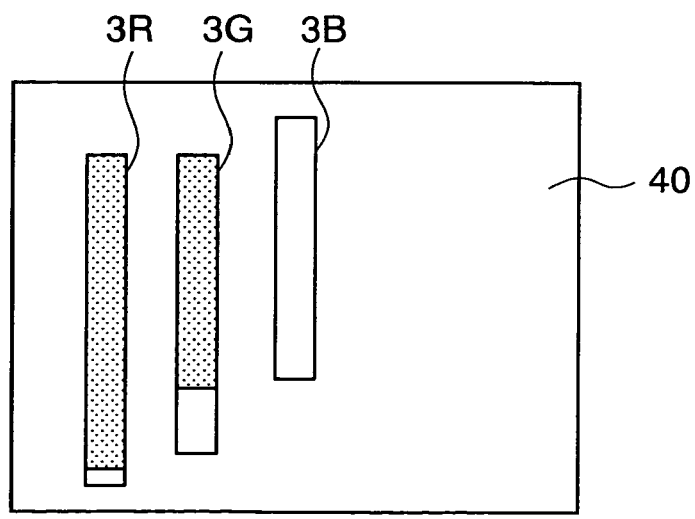
FIG. 34 is a view showing the method of manufacturing the organic EL device of the third embodiment of the present invention (10).

Subsequently, the edge of groove 3R is immersed in the resist stripper 4 to remove the red emitting layer 6R in the edge portion as shown in FIG. 33. FIG. 34 shows the state where the edge portion of red emitting layer 6R in the groove 3R has been removed.

Figure 35:
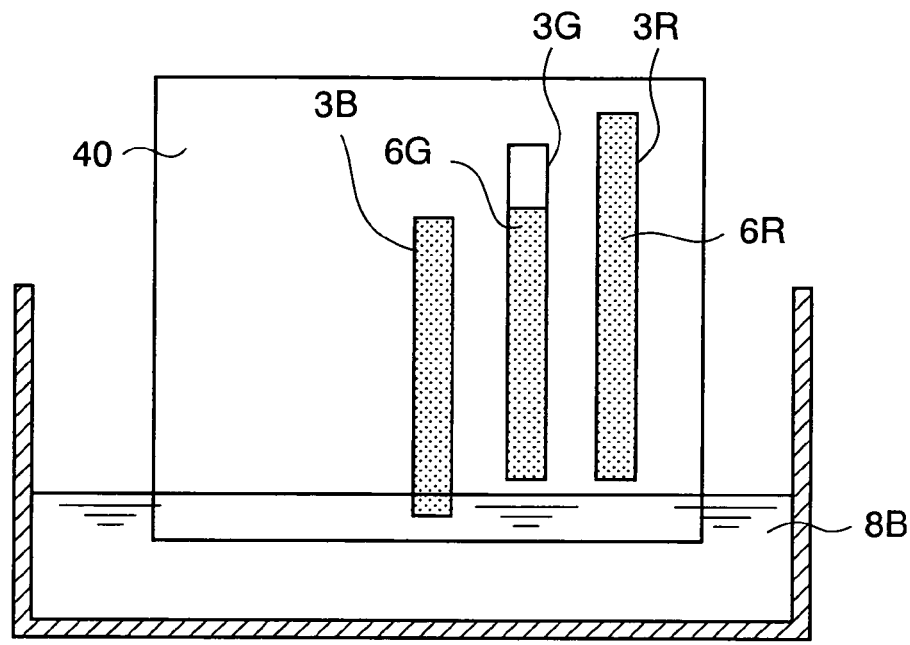
FIG. 35 is a view showing the method of manufacturing the organic EL device of the third embodiment of the present invention (11).

Next, as shown in FIG. 35, a container with the polymeric organic EL solution (blue solution) 8B that becomes the blue emitting layer is prepared. Then, the edge of the other end of groove 3B is immersed in the blue solution 8B while standing the substrate 40 upright. Consequently, capillary phenomenon allows the blue solution 8B to enter the groove 3B above the liquid surface and the entire groove 3B is filled with the blue solution 8B.

Figure 36:
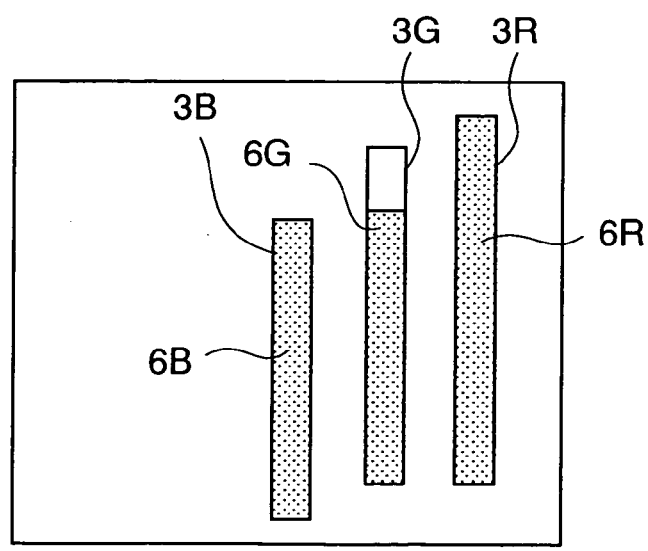
FIG. 36 is a view showing the method of manufacturing the organic EL device of the third embodiment of the present invention (12).

At this time, since the edge of the other sides of the groove for red sub-pixel 3R and the edge of the groove for green sub-pixel 3G are apart from the blue solution 8B, the blue solution 8B does not enter the grooves (3R, 3G). Next, the substrate 40 is pulled out from the blue solution, and dried to let toluene evaporate from the blue solution 8B in the groove. As a result, a green-emitting organic EL layer 6B is formed in the groove 3B as shown in FIG. 36.

Subsequently, similar to the first embodiment, the insulating film 61 is formed and then the grooves are formed in the insulating film 61 to expose the organic EL layers (6R, 6G, 6B). After that, the cathode 63 is formed by the Al/Li alloy.

The effects same as those of the first embodiment are also obtained in this embodiment. Further, this embodiment has an advantage that the stopper 5a may be formed only in the groove for red sub-pixel 3R and only one stripping process to the stopper is required.

The invention claimed is:

1. A method of manufacturing an organic EL device, comprising:
    forming first and second grooves in an insulating film on a substrate while the positions of their one edge portions are shifted from each other;
    forming a stopper to prevent a solution from filling the length of said first groove;
    immersing said one edge portions of said first and second grooves in a first solution in which a first organic EL material is dissolved, and filling said second groove with said first solution while said stopper prevents said first solution from filling the length of said first groove;
    removing said stopper; and
    immersing said one edge portion of said first groove in a second solution in the state where said second groove is apart from said second solution in which a second organic EL material is dissolved, and filling said first groove with said second solution.

2. The method of claim 1, wherein
the first and second grooves extend over two or more pixel sites.

3. A method of manufacturing an organic EL device, comprising:
    forming first and second grooves extending over two or more pixel sites in an insulating film on a substrate while the positions of their one edge portions and the other edge portions are shifted from each other;
    immersing said one edge portion of said second groove in a first solution in the state where said first groove is apart from said first solution in which a first organic EL material is dissolved, and filling said second groove with said first solution; and
    immersing said other edge portion of said first groove in a second solution in the state where said second groove is apart from said second solution in which a second organic EL material is dissolved, and filling said first groove with said second solution.

4. A method of manufacturing an organic EL device, comprising:
forming first, second and third grooves in an insulating film on a substrate while the positions of their one edge portions are shifted from each other;
forming first and second stoppers to prevent a solution from filling the length of said first and second grooves;
preparing a first solution in which an organic material of a first luminescence color is dissolved;
immersing said other edge portions of said first, second and third grooves in said first solution, and filling said third groove with said first solution while said first and second stoppers prevent said first solution from filling the length of said first and second grooves;
removing said second stopper;
preparing a second solution in which an organic material of a second luminescence color is dissolved;
immersing said one edge portions of said first and second grooves in said second solution in the state where said third groove is apart from said second solution, and filling said second solution in said second groove while said first stopper prevents said second solution from filling the length of said second groove;
preparing a third solution in which an organic EL material of a third luminescence color is dissolved; and
immersing said one edge portion of said first groove in said third solution in the state where said second and third grooves are apart from said third solution, and filling said third groove with said third solution.

5. The method of manufacturing the organic EL device according to claim 4, wherein
a plurality of said first, second and third grooves are formed for one pixel.

6. The method of manufacturing the organic EL device according to claim 5, wherein
at least one of said first, second and third grooves is formed in the different number from the number of the other grooves.

7. The method of manufacturing the organic EL device according to claim 4, wherein
at least one of said first, second and third grooves is formed in a different width from the other grooves.

8. The method of manufacturing the organic EL device according to claim 4, wherein
the first, second and third grooves extend over two or more pixel sites.

9. A method of manufacturing an organic EL device, comprising:
forming first, second and third grooves in an insulating film on a substrate while the positions of their one edge portions are shifted from each other and the position of the other edge portion of the third groove is shifted from the edge portions of said first and second grooves;
forming a stopper to prevent a solution from filling the length of said first groove;
preparing a first solution in which an organic material of a first luminescence color is dissolved;
immersing said one edge portions of said first and second grooves in the first solution in the state where said third groove is apart from said first solution, and filling said second groove with said first solution while said stopper prevents said first solution from filling the length of said first groove;
removing said stopper;
preparing a second solution in which an organic material of a second luminescence color is dissolved;
immersing said one edge portion of said first groove in said second solution in the state where said second and third grooves are apart from said second solution, and filling said first groove with said second solution;
preparing a third solution in which an organic material of a third luminescence color is dissolved; and
immersing said other edge portion of said third groove in said third solution in the state where said first and second grooves are apart from said third solution, and filling said third groove said third solution.

10. The method of manufacturing the organic EL device according to claim 9, wherein
a plurality of said first, second and third grooves are formed for one pixel.

11. The method of manufacturing the organic EL device according to claim 10, wherein
at least one of said first, second and third grooves is formed in the different number from the number of the other grooves.

12. The method of manufacturing the organic EL device according to claim 9, wherein
at least one of said first, second and third grooves is formed in a different width from the other grooves.

13. The method of manufacturing the organic EL device according to claim 9, wherein
the first, second and third grooves extend over two or more pixel sites.

14. An organic EL device, comprising:
a substrate;
a first insulating film formed on said substrate;
a first electrode formed on said insulating film;
a second insulating film, which is formed on said insulating film and in which grooves are extended over two or more pixel sites and are provided on a position corresponding to said first electrode;
an organic EL layer that is formed in said grooves and whose one surface is electrically connected to said first electrode; and
a second electrode electrically connected to the other surface of said organic EL layer
wherein plural sets of said grooves are provided in one pixel region and the luminescence colors of the organic EL layers formed in each set of grooves are different from each other.

15. The organic EL device according to claim 14, wherein the number of grooves of at least one set of each set is larger than the number of grooves of the other sets.

16. The organic EL device according to claim 14, wherein the width of at least one set of each set is wider than the width of the grooves of the other sets.

17. The organic EL device according to claim 14, wherein
a buffer layer is provided at least between said first electrode and said organic EL layer or between said organic EL layer and said second electrode.

18. A method of manufacturing an organic EL device, comprising:
forming grooves extending over two or more pixel sites in an insulating film on a substrate;
filling said grooves by capillary phenomenon with a solution in which a material that becomes an electrode is dissolved; and
drying said solution.

19. An organic EL device, comprising:
a substrate;
a first insulating film formed on said substrate;
a first electrode formed on said insulating film;

a second insulating film, which is formed on said insulating film and in which grooves are provided on a position corresponding to said first electrode;

an organic EL layer that is formed in said grooves and whose one surface is electrically connected to said first electrode; and a second electrode electrically connected to the other surface of said organic EL layer, wherein:

plural sets of said grooves are provided in one pixel region; and the luminescence colors of the organic EL layers formed in each set of grooves are different from each other.

20. The organic EL device according to claim 19, wherein the number of grooves of at least one set of each set is larger than the number of grooves of the other sets.

21. The organic EL device according to claim 19, wherein the width of at least one set of each set is wider than the width of the grooves of the other sets.

* * * * *